United States Patent
Kawai et al.

(10) Patent No.: US 6,630,417 B2
(45) Date of Patent: Oct. 7, 2003

(54) PORCELAIN COMPOSITION, PORCELAIN AND METHOD OF PRODUCING THE SAME, AND WIRING BOARD AND METHOD OF PRODUCING THE SAME

(75) Inventors: Shinya Kawai, Kagoshima (JP); Hiromi Iwachi, Kagoshima (JP); Yoshitake Terashi, Kagoshima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/871,601

(22) Filed: May 30, 2001

(65) Prior Publication Data

US 2002/0039645 A1 Apr. 4, 2002

(30) Foreign Application Priority Data

| May 30, 2000 | (JP) | 2000-160746 |
| May 30, 2000 | (JP) | 2000-160747 |
| Dec. 26, 2000 | (JP) | 2000-396297 |
| Jan. 30, 2001 | (JP) | 2001-022255 |

(51) Int. Cl.$^7$ ............................................. C03C 3/064
(52) U.S. Cl. ........................ 501/16; 501/5; 501/32; 501/49; 501/67; 501/77
(58) Field of Search .................. 501/32, 49, 67, 501/5, 16, 77

(56) References Cited

U.S. PATENT DOCUMENTS 5,468,694 A * 11/1995 Taguchi et al. .............. 501/77
5,756,408 A * 5/1998 Terashi et al. ............... 501/8
6,201,307 B1 * 3/2001 Terashi et al. ............... 257/784
6,232,251 B1 * 5/2001 Terashi et al. ............... 501/5

FOREIGN PATENT DOCUMENTS

| JP | 60-240135 | 11/1985 |
| JP | 63-307182 | 12/1988 |
| JP | 02-196066 | 8/1990 |
| JP | 04-12639 | 3/1992 |
| JP | 04-254477 | 9/1992 |
| JP | 05-298919 | 11/1993 |

* cited by examiner

*Primary Examiner*—Cathy Lam
(74) *Attorney, Agent, or Firm*—Hogan & Hartson

(57) ABSTRACT

The porcelain of the present invention comprises 5 to 70% by weight of a non-oxide ceramic filler and 30 to 95% by weight of a borosilicate glass having a glass transition temperature of 800° C. or lower, wherein a weight loss per unit surface area of said non-oxide ceramics is not more than 0.15 g/cm$^2$ after dipping said non-oxide ceramic having purity of not less than 96% by weight for five minutes in a glass melt obtained by melting said borosilicate glass with heating at 1200° C. Since the porcelain composition can be fired at a low temperature together with a low-resistance metal, the resulting porcelain has a high thermal conductivity, a low dielectric constant, a high heat dissipation property and a reduced apparent signal delay in a high frequency signal and is suited for use as an insulating board in a wiring board.

10 Claims, 4 Drawing Sheets

PORCELAIN COMPOSITION, PORCELAIN AND METHOD OF PRODUCING THE SAME, AND WIRING BOARD AND METHOD OF PRODUCING THE SAME

FIELD OF THE INVENTION

The present invention relates to a porcelain composition capable of being fired at a low temperature and is best suited for use in a semiconductor element housing package, a wiring board applied to a multi-layer wiring board or the like, to a porcelain and a method of producing the same, and to a wiring board and a method of producing the same. More particularly, the present invention relates to an improvement of a porcelain which can be fired together with a low-resistance conductor material such as copper, silver or gold and has a low dielectric constant, and also is capable of efficiently dissipating heat generated by the operation of an active element such as semiconductor element, for the purpose of reducing signal delay.

BACKGROUND OF THE INVENTION

Recently, as the information processing technology and communication technology advance in an ever faster rate and are increasingly utilized in everyday life, semiconductor elements are becoming faster in operation and larger in size. As the operation speeds of the semiconductor elements increase, the problem of delay in signal transmission caused by the package, board or the like becomes serious. At the same time, heat resistance of the package and the board poses a significant problem as more heat is generated by the larger semiconductor elements.

In the field of ceramic multi-layer wiring board in the prior art, the most commonly used is an alumina wiring board comprising an insulating layer made of alumina ceramics and a wiring layer made of a high-melting point metal such as tungsten or molybdenum formed on the surface of inside of the insulating layer.

However, in a conventional alumina wiring board, a conductor made of a high-melting point metal such as tungsten (W) or molybdenum (Mo) has a high electrical resistance which, together with the dielectric constant of alumina as high as about 9, results in a significant delay in the signal transmission. For this reason, it has been required to use a low-resistance metal such as copper, silver or gold in place of W or Mo, and decrease the dielectric constant of the insulating layer.

With this background, development efforts have recently been made on wiring boards made of glass ceramics in which the insulating layer is made of glass or glass ceramics which is a composite material of glass and ceramic thereby making it possible to fire the layer at a relatively low temperature of 1050° C. or lower so that a low-resistance metal such as copper, silver or gold which has a low melting point can be used as the conductor, and the dielectric constant can be made lower than that of alumina.

For example, Examined Patent Publication (Kokoku) No. 4-12639 discloses a multi-layer wiring board made by firing an insulating layer made of glass with a SiO$_2$ filler added thereto and a wiring layer made of a low-resistance metal such as copper, silver or gold simultaneously at a temperature within a range from 900 to 1000° C. Unexamined Patent Publication (Kokai) No. 60-240135 discloses a wiring board made by firing a zinc borosilicate glass with a filler of alumina, zirconia or mullite added thereto together with a metal having a low resistance. Unexamined Patent Publication (Kokai) No. 5-298919 proposes a glass ceramic material wherein mullite or cordierite is precipitated in the crystal phase.

However, the conventional glass ceramic materials such as those described above have a low thermal conductivity within a range from 0.5 to 1.5 W/m·K, resulting in lower heat dissipation property than alumina and other conventional materials. To solve this problem, Unexamined Patent Publication (Kokai) No. 63-307182 and Unexamined Patent Publication (Kokai) No. 4-254477 disclose wiring boards using glass ceramics made by firing AlN of a high thermal conductivity and glass. Unexamined Patent Publication (Kokai) No. 2-196066 discloses a glass ceramic material made by adding an AlN powder having a small particle diameter and an AlN powder having a large particle diameter of not less 2 μm, forming the mixture into a green body and firing the green body at 950° C.

However, when the non-oxide porcelain such as AlN is used as a filler, the glass and the non-oxide ceramic filler react with each other when fired, and the non-oxide porcelain filler is decomposed to evolve a decomposition gas. This gas has caused such problems as swelling of the porcelain, and degradation in the dimensional accuracy, mechanical strength and water absorption. There has also been such a problem that bubbles are generated in the surface of the porcelain, resulting in rough surface and a metallized wiring layer peeling off. Thus it has been difficult to manufacture satisfactory porcelain consistently, resulting in low yield of production and difficulty in volume production thereof as an industrial product. Since such problems become conspicuous when firing in an oxidizing atmosphere such as air, it has been very difficult to form a wiring layer using copper as the conductor, and the fault of removal of the binder is likely to occur when making wiring with copper.

With the method of mixing the glass powder and the AlN powder and firing the green body, it is difficult to make dense glass ceramics at a firing temperatures of 1050° C. or lower in case the average particle size of the AlN powder is smaller than 2 μm. This may result in lower mechanical strength of the glass ceramics and/or degradation of the insulation property of the glass ceramics due to water absorption.

Known methods of the AlN powder include the direct nitriding method wherein a metallic Al powder is heated and nitrided at a high temperature of about 2000° C. in a pressurized nitrogen atmosphere, and reducing nitriding method wherein an Al$_2$O$_3$ (alumina) powder with carbon added thereto is nitrided in a nitrogen atmosphere. The reducing nitriding method has such problems that the material cost and the production cost are high, and powder having a large particle diameter cannot be made with high purity. The direct nitriding method, on the other hand, requires processing at a high temperature under a high pressure, and, therefore, the metal Al cannot be completely nitrided with a part of the metal Al being left as an impurity. When much metal Al remains in the porcelain, voids are likely to be formed between the glass and the AlN particles. The voids cause such problems as a decrease in the mechanical strength, lower insulation property due to water absorption by the porcelain, higher dielectric constant and an increase of dielectric loss. Supposed cause of the voids being formed between the glass and the AlN particles is the active property of metal Al which results in reaction with the glass powder during firing, thus evolving a gas.

SUMMARY OF THE INVENTION

A major object of the present invention is to provide a porcelain composition and a porcelain, which are capable of being fired at a low temperature, together with a low-resistance metal such as copper, silver or gold, and have a high thermal conductivity and a low dielectric constant, and a wiring board using the same.

Another object of the present invention is to provide a porcelain and a method of producing the same having an improved yield of production (i.e. high yield of non-defective units), and a wiring board and a method of producing the same.

The porcelain composition capable of being fired at a low temperature comprises 30 to 95% by weight of a borosilicate glass and 5 to 70% by weight of a non-oxide ceramic filler, wherein said borosilicate glass has a glass transition point of 800° C. or lower and a weight loss per unit surface area of said non-oxide ceramics is not more than 0.15 g/cm$^2$ after dipping said non-oxide ceramic having purity of not less than 96% by weight in a glass melt obtained by melting said borosilicate glass with heating at 1200° C. for five minutes.

The weight loss described above can be used as an index for evaluation of the reactivity between the borosilicate glass and the non-oxide porcelain filler. When the weight loss is within the range described above, since the reactivity is inhibited, the resulting porcelain composition can be fired together with a low-resistance and low-melting point metal such as copper, silver or gold, particularly silver, and has a high thermal conductivity and a low dielectric constant. Thus the low-temperature fired porcelain and a wiring board using the same can be produced with a high yield.

The low-temperature fired porcelain of the present invention is a dense material comprising a non-oxide porcelain phase and a borosilicate glass phase, and has a relative density of not less than 95% and a thermal conductivity of not less than 2 W/m·K, and also a ratio of the number of circular voids to the total number of voids is not more than 50% or less as observed in a cross section. The number of circular voids indicates the reactivity between the borosilicate glass and the non-oxide porcelain. The low-temperature fired porcelain having the number of circular voids within the range described above can be preferably used as an insulating board in a wiring board provided with a wiring layer made of a low-resistance metal.

The porcelain is produced by forming the porcelain composition into a predetermined shape, and firing the resulting green body at 1050° C. or lower. The firing atmosphere is particularly preferably an oxidizing atmosphere. In the production of the wiring board, a conductive paste made of a low-resistance metal is printed on the surface of the green body, and then fired at 1050° C. or lower.

The non-oxide ceramic filler and the non-oxide ceramic phase may comprises at least one selected from the group consisting of AlN, Si$_3$N$_4$, SiC and BN.

The total amount of Pb, Bi, Cu and alkali metal elements in the glass is not more than 0.5% by weight, most effectively, to control the reactivity with the non-oxide ceramic filler. Furthermore, a portion or all of the glass is preferably crystallized by firing the composition to enhance the strength and thermal conductivity.

Another porcelain (ceramic sintered body) of the present invention comprises a spinel compound crystal phase and a non-oxide ceramic phase (non-oxide compound crystal phase) made of at least one selected the group consisting of AlN, Si$_3$N$_4$, SiC and BN, wherein a relative density is not less than 95% and a dielectric constant is not more than 8, and a thermal conductivity is not less than 2 W/m·K. The porcelain can be fired together with a low-resistance and low-melting point metal such as copper, silver or gold, particularly silver, and can inhibit the reaction between the glass and the non-oxide compound powder, thus making it possible to produce a fired porcelain having a high thermal conductivity and a low dielectric constant with a high yield. Similarly, the porcelain can also be used as an insulating board in a wiring board provided with a wiring layer made of a low-resistance metal.

The spinel compound preferably comprises at least one selected from gahnite (ZnAl$_2$O$_4$) and spinel (MgAl$_2$O$_4$).

In addition to those described above, the sintered body may contain at least one selected from a mullite crystal phase and a cordierite crystal phase as the crystal phase, or preferably contains at least one of a (M1)Al$_2$Si$_2$O$_8$ (M1 is at least one of Ca, Sr and Ba) crystal phase and a (M2)$_2$MgSi$_2$O$_7$ (M2 is at least one of Ca, Sr and Ba) crystal phase.

Such a sintered body is formed by forming a mixed powder containing at least 30 to 95% by weight of a borosilicate glass powder containing at least SiO$_2$, Al$_2$O$_3$, ZnO and B$_2$O$_3$ and 5 to 70% by weight of a non-oxide ceramic filler selected made of at least one selected from the group consisting of AlN, Si$_3$N$_4$, SiC and BN, into a predetermined shape, and firing the resulting green body. The borosilicate glass powder preferably contains 10 to 55% by weight of SiO$_2$, 3 to 35% by weight of Al$_2$O$_3$, 2 to 25% by weight of ZnO, 3 to 25% by weight of B$_2$O$_3$, 0 to 30% by weight of MgO, and 0 to 50% by weight of at least one selected from CaO, SrO and BaO.

The present inventors have studied intensively about properties of the AlN powder in the porcelain obtained by sintering the mixture of the glass powder and the AlN powder. As a result, they have found that a porcelain having a low dielectric constant and a low dielectric loss can be made, while maintaining a high denseness, a high strength, a low water absorption percentage and a high thermal conductivity, by using the AlN powder having a reduced content of metallic Al of hot more than 1000 ppm, which is obtained by treating the AlN powder having an average particle diameter of not less than 2 $\mu$m made by the direct nitriding method with a chemical, thereby to dissolve and remove metallic Al remained in the AlN powder. This reason is presumed as follows. That is, the reaction between the glass powder and the AlN powder accompanied with gas evolution is inhibited by reducing the content of metallic Al in the AlN powder, thereby making it possible to densely bond the glass powder with the AlN powder.

That is, still another porcelain (glass ceramics) of the present invention comprises a matrix made of glass and/or a crystal precipitated from the glass and AlN particles having an average particle diameter of not less than 2 $\mu$m dispersed in the matrix, wherein the content of metallic Al is not more than 800 ppm based on the total amount.

The total amount of Li, K, Na, Pb and Bi is preferably not more than 15% by weight in terms of oxides (Li$_2$O, K$_2$O, Na$_2$O, PbO and Bi$_2$O$_3$). The amount the AlN particles is preferably within a range from 35 to 80% by weight.

The porcelain can be produced by mixing a glass powder with an AlN powder having an average particle diameter of not less than 2 $\mu$m and a metallic Al content of not more than 1000 ppm, forming the mixture, and firing the resulting green body at 1050° C. or lower. The glass powder preferably has an average-particle diameter of less than 2 $\mu$m.

The wiring board of the present invention comprises an insulating board and a wiring layer formed on the surface of the insulating board and/or inside thereof, wherein the insulating board is made of the porcelain. The wiring layer contains a conductor made of at least one selected from gold, silver and copper.

Various objects as well as other advantages become apparent from the following descriptions.

DETAILED DESCRIPTION OF THE PREFERRED ENBODIMENTS

[First Embodiment]

Figure 1:
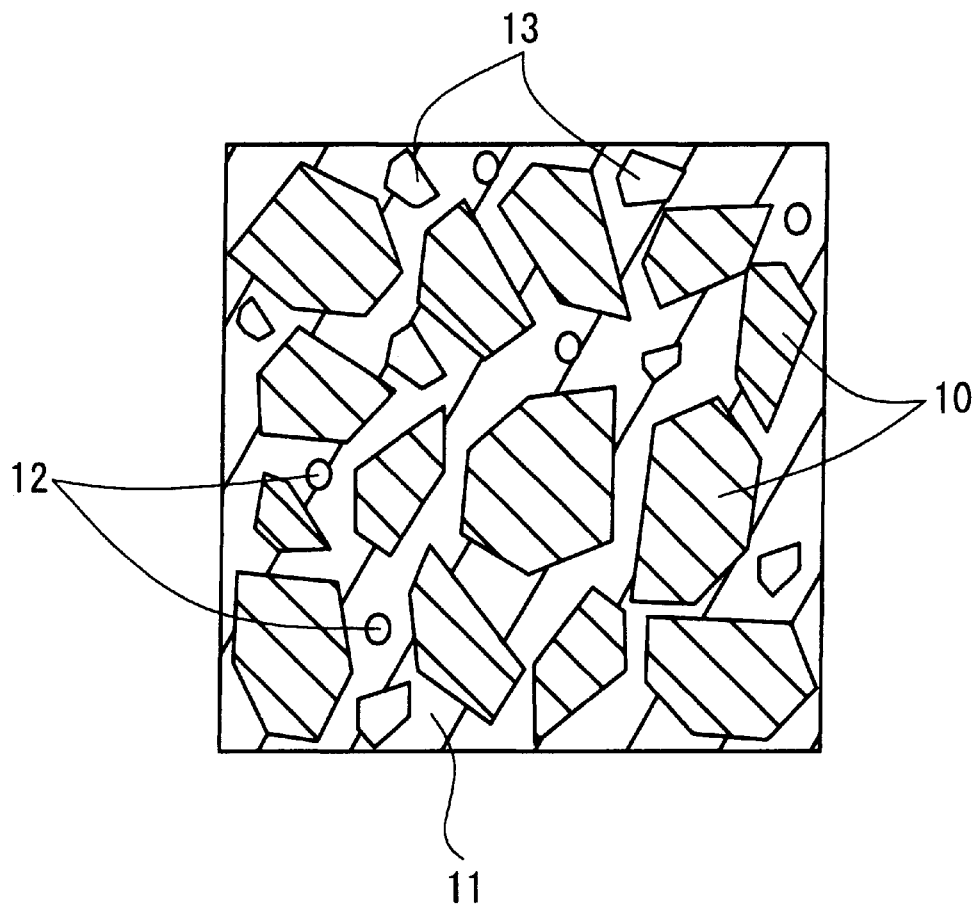
FIG. 1 is a schematic view showing the structure of the porcelain as one embodiment according to the present invention.

The porcelain composition capable of being fired at low temperature in this embodiment comprises 30 to 95% by weight, preferably 32.5 to 85% by weight, more preferably 35 to 75% by weight, of a borosilicate glass and 5 to 70% by weight, preferably 15 to 67.5% by weight, more preferably 25 to 65% by weight, of a non-oxide ceramic filler.

The reason for limitation of the composition of the glass and that of the filler within the above range is as follows. When the amount of the borosilicate glass is less than 30% by weight or the amount of the non-oxide ceramic filler is more than 70% by weight, it becomes difficult to obtain a dense porcelain having a relative density of not less than 95% by firing at low temperature of 1050° C. or lower. On the other hand, when the amount of the glass exceeds 95% by weight or the non-oxide ceramic filler is less than 5% by weight, the effect of improving the thermal conductivity of the porcelain becomes insufficient.

The borosilicate glass is glass containing, as an essential component, a glass component such as $SiO_2$ and $B_2O_3$ and, specifically, it contains 15 to 70% by weight of $SiO_2$ and 0.5 to 30% by weight of $B_2O_3$. This glass can further contain at least one selected from the group consisting of MgO, CaO, SrO, BaO, ZnO and $Al_2O_3$ as the other component.

It is necessary that the borosilicate glass has a glass transition temperature of 800° C. or lower, preferably 750° C. or lower, and more preferably 700° C. or lower. When the glass transition temperature is 800° C. or higher, it becomes difficult to obtain a dense porcelain by firing at low temperature of 1050° C. or lower.

Furthermore, it is important that the glass is molten with heating at 1200° C. to form a glass melt and a weight loss per unit surface area of the non-oxide ceramics is not more than 0.15 g/cm², preferably not more than 0.12 g/cm², and more preferably not more than 0.1 g/cm², after dipping the ceramics having purity of not less than 96% by weight in the melt for five minutes.

The test for examining the weight loss of the non-oxide ceramics is conducted for evaluating the reactivity between the glass to used and the non-oxide ceramics to be added as the filler during firing. When the weight loss as a result of this test is more than 0.15 g/cm², the reaction with the non-oxide ceramic filler proceeds to evolve a gas, thus causing degradation of the dimensional accuracy of the composition and formation of bubbles on the surface of the composition. Therefore, the yield is drastically reduced and the bubbles are formed too much, thereby making it impossible to obtain a dense porcelain.

The non-oxide ceramics used in the evaluation method described above are not specifically limited as far as the non-oxide ceramics have purity of not less than 96% by weight and the relative density of not less than 95%. Even if the non-oxide ceramics contain known sintering agents as the other component, any influence is scarcely exerted on the weight loss to be measured.

According to the present invention, it is very important to inhibit the reactivity between the glass and the non-oxide ceramic filler. This reactivity is evaluated by the method as described above. It is required to appropriately control the composition of the glass, the firing temperature and the firing atmosphere to inhibit the reactivity. Particularly in the glass composition, the total amount of Pb, Bi, Cu and alkali metal elements is controlled to 0.5% by weight or less, preferably 0.3% by weight or less, and more preferably 0.1% by weight or less. This reason is as follows. That is, the specific components are components for promoting the reaction with the non-oxide ceramic filler and, when the specific components exist in the amount which exceeds the above range, the weight loss exceeds 0.15 g/cm² even in the above evaluation method.

Furthermore, the thermal conductivity and the strength can be improved by crystallizing the glass to be used when firing the glass itself or the composition containing the filler. Specifically, not less than 20%, particularly not less than 30%, of the glass is preferably crystallized by firing.

The crystal phase precipitated by the crystallization of the glass includes known crystal phases, for example, $SiO_2$, $Al_2O_3$, $SrAl_2Si_2O_8$, $BaAl_2Si_2O_8$, $CaAl_2Si_2O_8$, $MgAl_2O_4$, $ZnAl_2O_3$, $MgSiO_3$, $Mg_2SiO_4$, $Zn_2SiO_4$, $Ca_2MgSi_2O_7$, $Sr_2MgSi_2O_7$, $Ba_2MgSi_2O_7$, $CaMgSi_2O_6$, $Mg_2Al_4Si_5O_{18}$, $Zn_2Al_4Si_5O_{18}$, and mullite. The crystallinity (%) of the glass can by determined by the Rietveld analysis.

On the other hand, the non-oxide ceramic filler is preferably made of at least one selected from the group consisting of AlN, $Si_3N_4$, SiC and BN, particularly at least one of AlN and $Si_3N_4$ to attain a high thermal conductivity. The non-oxide ceramic filler is preferably a powder having an average particle diameter within a range from 0.5 to 30 μm. When the average particle diameter is smaller than 0.5 μm, the effect of improving the thermal conductivity is insufficient. On the other hand, when the average particle diameter is larger than 30 μm, it becomes difficult to obtain a uniform green body.

To make a porcelain, a predetermined organic binder is added to a mixture of the above composition and the mixture is formed into a predetermined shape. As the forming method, a known method is used and examples thereof include metallic mold pressing, injection molding, casting, extrusion molding, cold hydrostatic pressing, and doctor blade methods.

The resulting green body is heated at a temperature within a range from 400 to 750° C., thereby to decompose and remove the organic binder component, and then the green body is fired at 1050° C. or lower, thus obtaining a porcelain.

This composition makes it possible to remove the organic binder in an air because the reactivity between the glass and non-oxide ceramics is inhibited even in an oxidizing atmosphere such as air. Furthermore, a dense porcelain can be made by firing not only in an inert atmosphere such as nitrogen and a nitrogen/hydrogen mixed atmosphere, but also in an oxidizing atmosphere such as air, after the removal of the organic binder.

The porcelain thus obtained contains 5 to 70% by weight of a non-oxide ceramic phase and 30 to 95% by weight of a borosilicate phase, and is made of a dense material having a relative density of not less than 95%, and particularly not less than 96%.

When the reaction between the non-oxide ceramics and the glass proceeds, a decomposition gas such as $N_2$, NOx, $NH_3$, CO, $CO_2$ or the like evolves and the gas is remained in the form of circular voids in the porcelain. However, according to the present invention, the reaction between the non-oxide ceramics and the glass can be inhibited, thereby reducing the formation of circular voids due to the decomposition gas. That is, the number of these circular voids can be used an index for the presence or absence of the reactivity. In the porcelain of the present invention, therefore, voids existing in the porcelain is mainly composed of voids having an irregular shape formed in a sound sintering process and the number of circular voids due to the decomposition gas is small. Specifically, a ratio of the number of circular voids to the total number of voids is not more than 50%, preferably not more than 40%, and more preferably not more than 30%, as observed in a cross section. This is a large feature of the porcelain according to the present invention.

To distinguish circular voids from voids having an irregular shape, voids wherein a ratio of the roundness defined in JIS B0621 of the voids to be observed to an auxiliary circle is not more than 30% are considered to be circular voids and the calculation is conducted.

The porcelain of the present invention has a high thermal conductivity of not less than 2 W/m·K, preferably not less than 2.5 W/m·K, and more preferably not less than 3 W/m·K, in view of characteristics.

The porcelain of the present invention contains, as a crystal phase, a non-oxide ceramic phase made of at least one selected from the group consisting of AlN, $Si_3N_4$, SiC and BN, particularly at least one selected from the group consisting of AlN and $Si_3N_4$. These crystal phases are required to improve the thermal conductivity of the porcelain.

FIG. 1 is a schematic view for explaining the structure of the porcelain of this embodiment. As shown in FIG. 1, this porcelain is mainly composed of a non-oxide ceramic phase 10 and a borosilicate glass phase 11, which exists as a matrix phase around the non-oxide ceramic phase 10. A portion or all of the borosilicate glass phase 11 may be crystallized. Furthermore, the porcelain has such a structure that circular voids 12 and irregular voids 13 are scattered.

In the porcelain of the present invention, the other crystal phase may exist, in addition to the non-oxide ceramic phase 10 and the borosilicate glass phase 11. The other crystal phase is particularly preferably an oxide crystal phase and the oxide crystal phase may be added to the non-oxide ceramic filler and the glass in the form of the other filler in a starting composition, and may be precipitated from the glass.

It becomes possible to control characteristics of the resulting porcelain, for example, dielectric constant, dielectric loss, thermal expansion coefficient, fracture strength, fracture toughness, and thermal conductivity.

Examples of the oxide crystal phase include $SiO_2$, $Al_2O_3$, $SrAl_2Si_2O_8$, $BaAl_2Si_2O_8$, $CaAl_2Si_2O_8$, $ZrO_2$, $TiO_2$, ZnO, $MgAl_2O_4$, $ZnAl_2SiO_3$, $MgSiO_3$, $Mg_2Si_2O_4$, $Zn_2SiO_4$, $Ca_2MgSi_2O_7$, $Sr_2MgSi_2O_7$, $Ba_2MgSi_2O_7$, $CaMgSi_2O_6$, $Mg_2Al_4Si_5O_{18}$, $Zn_2Al_4Si_5O_{18}$, and mullite. These oxide crystal phases can be used alone or in combination and can be selected according to the purposes. The oxide crystal phase is not limited to these crystal phases.

Furthermore, the porcelain of the present invention exhibits a low dielectric constant as compared with a conventional alumina. This is because the dielectric constant can be reduced by using a borosilicate glass having a low dielectric constant even in case of using AlN, $Si_3N_4$ or SiC which has a comparatively high dielectric constant. The porcelain of the present invention exhibits a dielectric constant of not more than 8, particularly not more than 7.5, and best suitably not more than 7.0. Whereby the apparent signal delay in a high frequency signal can be reduced when the high frequency signal is transmitted to the wiring layer formed on the porcelain surface in the wiring board using this porcelain as an insulating board. Therefore, the porcelain of the present invention is suited for use as the insulating board in the high frequency wiring board.

Figure 2:
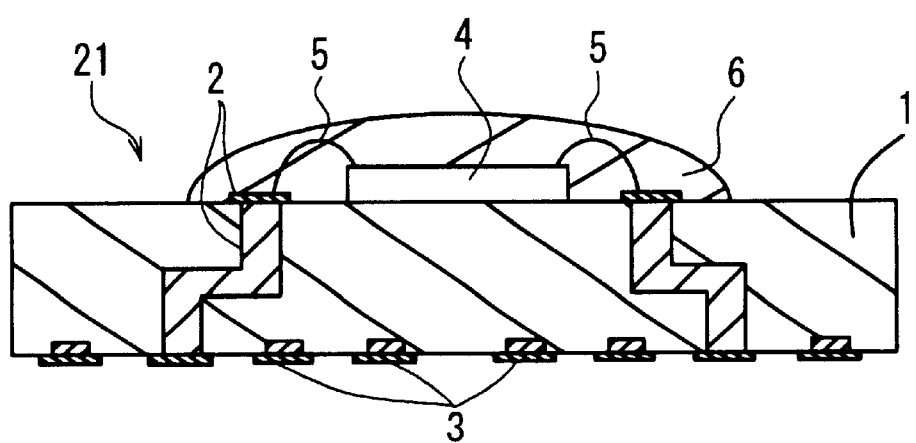
FIG. 2 is a schematic cross-sectional view showing one example of the semiconductor element housing package using the wiring board according to the present invention.

The porcelain composition and the porcelain of the present invention are most useful as the insulating board in the wiring board provided with the insulating board and the wiring layer. FIG. 2 is a schematic cross-sectional view showing the semiconductor element housing package, which houses a semiconductor element, as a typical example of the wiring board. As shown in FIG. 2, with respect to a package 21, a metallized wiring layer 2 is formed on the surface of an insulating board 1 and/or inside thereof, while plural connecting electrodes 3 are arranged on the lower surface of the insulating board 1. A semiconductor element 4 is fixed to the center portion of the upper surface of the insulating board 1 via glass and an adhesive such as resin. The semiconductor element 4 is electrically connected wit the metallized wiring layer 2 via a bonding wire 5, and the connection portion is sealed by coating with a sealing resin 6. The semiconductor element 4 and plural connecting electrodes 3 formed on the lower surface of the insulating board 1 are electrically connected with each other via the metallized wiring layer 2.

The insulating board 1 as shown in FIG. 2 is formed of the porcelain described above. The metallized wiring layer 2 and the connecting electrodes 3 are preferably made of a low-resistance metal of at least one selected from silver, copper and gold.

The method of producing the wiring board provided with the wiring layer using the above porcelain will now be described below. As described above, a composition composed of a non-oxide ceramic filler and a borosilicate glass is mixed with a proper organic binder, a proper organic solvent and a proper solvent to prepare a slurry and the slurry is formed into a sheet by a conventionally known doctor blade method, calendering roll method, calendering method, rolling method, press molding method or the like. Via holes are optionally formed on the resulting sheet, and then the via holes are filled with a metallic paste containing at least one selected from copper, gold and silver.

A predetermined circuit pattern (wiring layer) is print-coated on the surface of the green sheet in a thickness within a range from 5 to 30 μm by the screen printing method, gravure printing method or the like, using a metallic paste.

Plural green sheets are aligned, laminated and bonded and, after removing the organic component such as organic binder in an oxidizing or non-oxidizing atmosphere at 400–750° C., the laminate was fired in an oxidizing or non-oxidizing atmosphere at 1050° C. or lower, thus obtaining a wiring board.

Since the reactivity between the glass and the non-oxide ceramic filler in the oxidizing atmosphere is inhibited, the wiring layer can be formed of silver. In that case, any of the firing (firing temperature of 900° C. or lower) and the removal of the organic component can be conducted in an oxidizing atmosphere. In case the wiring layer is formed of copper, the atmosphere of the removal of the organic component and firing must be a non-oxidizing atmosphere such as $N_2$, $N_2/H_2O$ or the like.

On the surface of the wiring board thus formed, a semiconductor element is mounted and a wiring layer is connected thereto, thereby making it possible to transmit a signal. The semiconductor element is mounted directly on the wiring layer, thereby connecting them, or the wiring layer and the semiconductor element are connected with each other by wire bonding or a TAB tape or the like.

Furthermore, the semiconductor element can be airtightly sealed by bonding the same insulating material as that of the insulating board, the other insulating material, or a cap made of a metal having good heat dissipation property on the surface of the wiring board with the semiconductor element mounted thereon, using glass, a resin, or an adhesive such as brazing material, thus making it possible to make a semiconductor element housing package.

As described above in detail, according to this embodiment, it is made possible to fire at low temperature of 1050° C. or lower by using, as the glass to be formed into a composite together with the non-oxide ceramic filler, glass which exhibits a small weight loss of the non-oxide ceramic filler in the glass melt. In case the firing is conducted not only in a non-oxidizing atmosphere, but also in an oxidizing atmosphere, since the reactivity between the non-oxide ceramic filler and the glass is inhibited, the wiring layer can be formed by firing together with a low-resistance metal such as silver, copper or gold. Furthermore, since the porcelain has a high thermal conductivity and a low dielectric constant, it is made possible to produce a wiring board capable of enhancing the heat dissipation property and reducing apparent signal delay of a high frequency signal with a good dimensional accuracy.

[Second Embodiment]

The porcelain (ceramic sintered body) according to this embodiment is a sintered body made of a dense material having a relative density of not less than 95%, which has a structure comprising a glass phase, as a matrix, and a spinel compound crystal phase and a non-oxide ceramic phase (non-oxide compound crystal phase) made of at least one selected the group consisting of AlN, $Si_3N_4$, SiC and BN, which are dispersed in the glass phase. The glass phase is completely crystallized and may not contain an amorphous substantially.

To attain the sintered body having a high thermal conductivity, a crystal phase having a high thermal conductivity must be dispersed in the structure of the porcelain. Examples of the crystal phase having a high thermal conductivity include at least one of AlN, $Si_3N_4$, SiC and BN, particularly non-oxide ceramic phases made of AlN and/or $Si_3N_4$. The non-oxide ceramic compound is decomposed during the firing process to evolve a gas because of its high reactivity.

The reason why AlN, $Si_3N_4$, SiC and BN was selected as the non-oxide ceramic phase is that the thermal conductivity of the non-oxide ceramic phase is high and its reactivity with the glass is comparatively low. Among these, AlN and/or $Si_3N_4$ are particularly preferred.

As described below, however, when using amorphous glass or crystallized glass containing at least $SiO_2$, $Al_2O_3$, ZnO and $B_2O_3$, the reactivity with the non-oxide compound can be inhibited and evolution of a decomposition gas can be inhibited. The dielectric constant of the entire sintered body can be reduced because the glass has a low dielectric constant.

Thus it is made possible to obtain a porcelain which causes a small dimensional change of the sintered body after sintering and has a high thermal conductivity and a low dielectric constant. Specifically, the porcelain of this embodiment has a thermal conductivity of not less than 2 W/m·K, preferably not less than 2.5 W/m·K, more preferably not less than 3 W/m·K, and a dielectric constant of not more than 8, preferably not more than 7.5, more preferably not more than 7.

Such a sintered body is made by firing a green body of a mixed powder comprising 30 to 95% by weight, preferably 32.5 to 85% by weight, more preferably 35 to 80% by weight, of a borosilicate glass powder containing at least $SiO_2$, $Al_2O_3$, ZnO and $B_2O_3$ and 5 to 70% by weight, preferably 15 to 67.5% by weight, more preferably 20 to 65% by weight, of a non-oxide ceramic powder made of at least one selected from AlN, $Si_3N_4$, SiC and BN at 1050° C. or lower.

The sintered body contains Si, Al, Zn and B, in addition to the above non-oxide ceramic phase, in other words, at least $SiO_2$, $Al_2O_3$, ZnO and $B_2O_3$ are required as a component in the glass powder with the starting material composition. Furthermore, it may contain MgO, CaO, SrO, CaO or the like as an arbitrary component. The glass containing these components can inhibit gas evolution due to the reaction between the glass and the filler because of very low reactivity with the non-oxide ceramic filler during firing, thus making it possible to prevent degradation of the dimensional accuracy of the sintered body and drastic reduction of the yield due to formation of bubbles on the surface of the sintered body.

More specifically, the borosilicate glass powder contains 10 to 55% by weight, preferably 25 to 50% by weight, of $SiO_2$, 3 to 35% by weight, preferably 5 to 32 by weight, more preferably 8 to 25% by weight, of $Al_2O_3$, 2 to 25% by weight, preferably 4 to 25% by weight, of ZnO, 3 to 25 by weight, preferably 5 to 20% weight, of $B_2O_3$, 0 to 30 by weight, preferably 0 to 27% by weight, more preferably 0 to 25% by weight, of MgO, and 0 to 50% by weight, preferably 0 to 35% by weight in total, of at least one selected from CaO, SrO and BaO.

It is not preferred that the glass contains copper oxide, lead oxide, bismuth oxide and alkali metal oxides because the reactivity with the non-oxide compound is high thereby causing degradation of the dimensional accuracy and formation of bubbles.

It is preferred to control the total amount to 0.5% by weight or less in terms of oxides.

In the porcelain of this embodiment, a spinel compound crystal phase exists in the glass phase, in addition to the non-oxide ceramic phase. This spinel compound crystal phase has an operation of improving the thermal conductivity and the strength of the sintered body. The spinel compound crystal phase may be preferably gahnite ($ZnAl_2O_4$) and/or spinel ($MgAl_2O_4$). This spinel compound crystal phase may be a precipitated crystal phase from the glass with the above composition and the spinel compound can also be added as the filler. Precipitation of the spinel compound crystal phase from the glass is effective to obtain a more dense sintered body and its effect of improving the thermal conductivity and the strength is also large. Two spinel compound crystal phases described above may exist in the form of (Mg, Zn)Al$_2$O$_4$ wherein two spinel compound crystal phases are incorporated with each other in a solid state.

In addition to the non-oxide ceramic phase and the spinel compound crystal phase, the other crystal phase may exist as the crystal phase to be dispersed in the glass phase. It is effective to improve the thermal conductivity and the strength of the sintered body that the sintered body contains at least one of a mullite crystal phase and a cordierite crystal phase. The crystal phase may also be a precipitated crystal phase from the glass with the above composition and can be added as the filler. However, it is effective to obtain a more dense sintered body to precipitate from the glass and its effect of improving the thermal conductivity and the strength is large.

Figure 3:
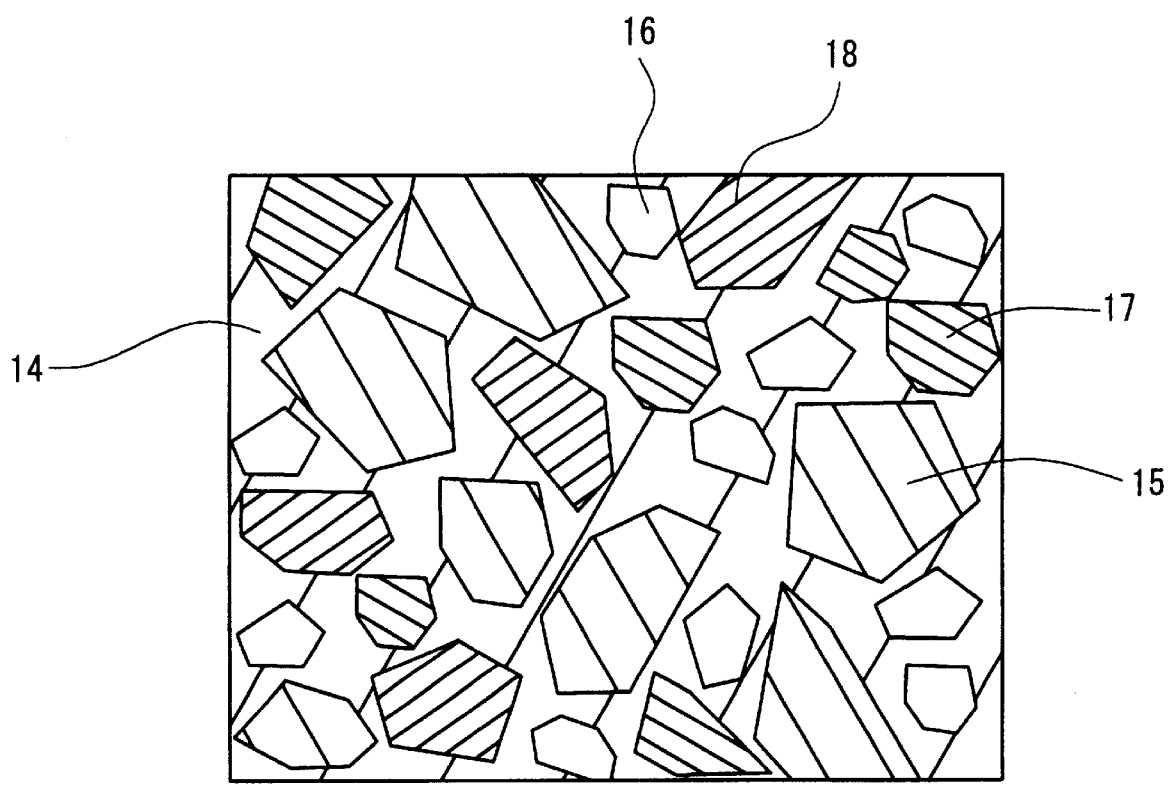
FIG. 3 is a schematic view showing the structure of the sintered body as another embodiment according to the present invention.

A schematic view for explaining the structure of one example of the porcelain (ceramic sintered body) of this embodiment is shown in FIG. 3. As shown in FIG. 3, this sintered body comprises a borosilicate glass phase 14, a non-oxide ceramic phase 15 and a spinel compound crystal phase 16 as an essential component, and further comprises crystal phases such a mullite crystal phase 17 and a cordierite crystal phase 18.

At least one selected from MgO, CaO, SrO and BaO, particularly MgO, is preferably incorporated into the glass powder. Incorporation of these components makes it possible to decrease the softening point of the glass and to increase the amount of the non-oxide compound. As a result, the thermal conductivity of the sintered body can be further improved.

As described above, in case the glass powder contains MgO, CaO, SrO and BaO, at least one selected from a (M1)Al$_2$Si$_2$O$_8$ (M1 is at least one selected from Ca, Sr and Ba) crystal phase and a (M2)$_2$MgSi$_2$O$_7$ (M2 is at least one selected from Ca, Sr and Ba) crystal phase is preferably precipitated from the glass phase, in addition to the non-oxide ceramic phase and the spinel compound crystal phase, thereby making it possible to improve the thermal conductivity and the strength of the sintered body and to precipitate the crystal phase in a needle shape, which is effective to improve the strength.

Figure 4:
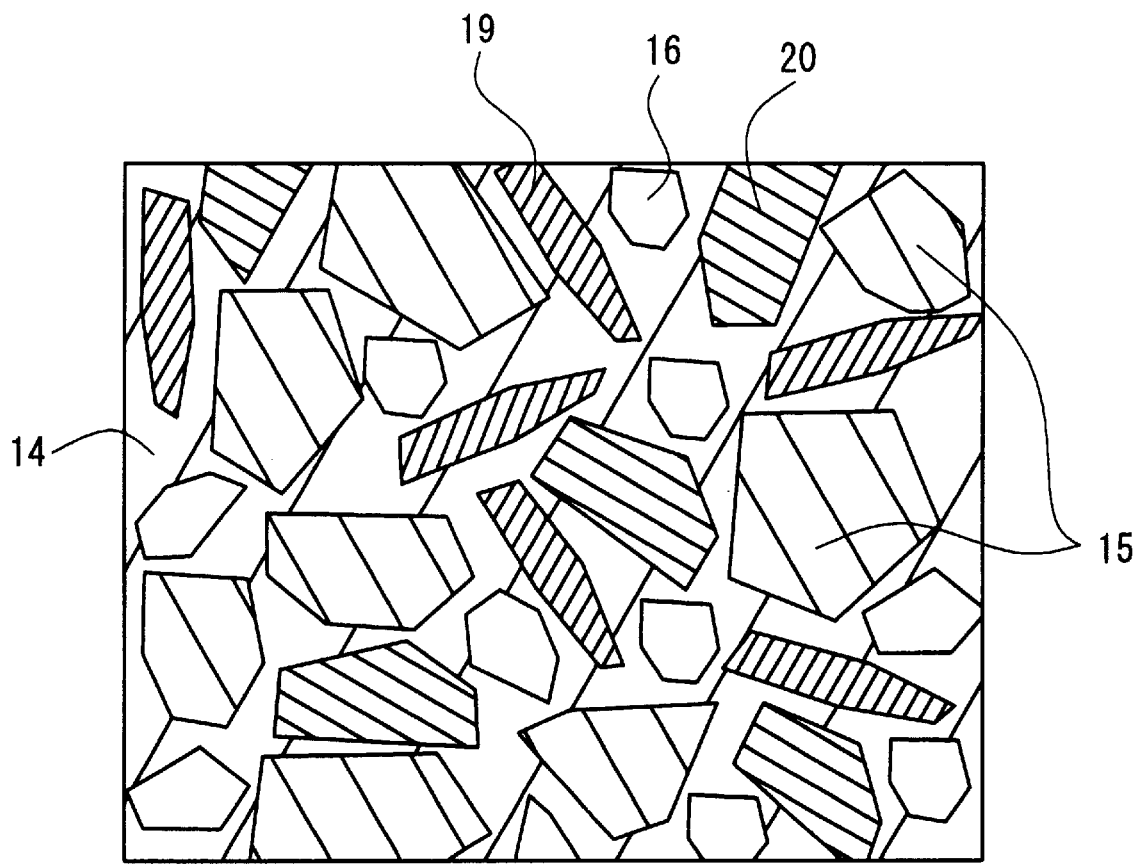
FIG. 4 is a schematic view showing the structure of another sintered body according to the present invention.

Accordingly, as shown in FIG. 4, another porcelain of this embodiment is composed of a (M1)Al$_2$Si$_2$O$_8$ crystal phase 19 and a (M2)$_2$MgSi$_2$O$_7$ crystal phase 20, in addition to the borosilicate glass phase 14, the non-oxide ceramic phase 15 and the spinel compound crystal phase 16.

In addition to the spinel compound crystal phase, the mullite crystal phase, the cordierite crystal phase, the (M1)Al$_2$Si$_2$O$_8$ crystal phase, the (M2)$_2$MgSi$_2$O$_7$ crystal phase and the on-oxide ceramic phase, the porcelain may contain one or plural oxide crystal phases.

These oxide crystal phases may be added as the filler during the mixing process of powders, or may be precipitated by crystallizing the glass. It becomes possible to control characteristics of the resulting porcelain, for example, dielectric constant, dielectric loss, thermal expansion coefficient, fracture strength, fracture toughness, and thermal conductivity by incorporating these oxide crystal phases into the sintered body.

Examples of the oxide crystal phase include SiO$_2$, Al$_2$O$_3$, ZrO$_2$, TiO$_2$, ZnO, MgSiO$_3$, Mg$_2$SiO$_4$, Zn$_2$SiO$_4$, CaMgSi$_2$O$_6$, and Zn$_2$Al$_4$Si$_5$O$_{18}$. These oxide crystal phases can be used alone or in combination and can be selected according to the purposes. The oxide crystal phase is not limited to these crystal phases.

The porcelain of this embodiment is used as the insulating board 1 in the package as shown in FIG. 2. It is preferred that the insulating board 1 has a thermal conductivity of less than 2 W/m·K, which is about 1 W/m·K higher than an ordinary value of a conventional glass ceramic, particularly not less than 2.5 W/m·K, best suitably not less than 3 W/m·K, and a dielectric constant of not more than 8, particularly not more than 7.5, best suitably not more than 7.

Such a wiring board can be produced by passing through the steps of preparing a slurry, forming into a green sheet, optionally forming through holes, filling the through holes with a metallic paste containing a low-resistance metal (copper, silver, gold), print-coating a wiring layer, laminating and bonding green sheets, and firing the laminate in the same manner as in the above-described embodiment. Other steps are the same as those in the wiring board in the above-described embodiment.

As described above in detail, according to this embodiment, it is made possible to fire at low temperature of 1050° C. or lower together with a low-resistance and low-melting point metal such as copper, silver or gold, particularly silver, by dispersing at least the spinel compound crystal phase and the non-oxide ceramic phase as the crystal phase in the glass or the crystallized glass phase in the sintered body constituting the insulating board, and to inhibit the reaction between the glass and the non-oxide ceramic filler powder, thus making it possible to provide a porcelain having a high thermal conductivity and a low dielectric constant, and a wiring board using the same can with a high yield.

[Third Embodiment]

The porcelain (glass ceramics) of this embodiment is obtained by dispersing AlN particles having an average particle diameter of not less than 2 μm, preferably not less than 3 μm, more preferably not less than 5 μm, in a matrix made of glass and/or a crystal precipitated from the glass, wherein the content of metallic Al in the porcelain is not more than 800 ppm based on the total amount.

Whereby the dielectric constant and the dielectric loss of the porcelain can be reduced. Accordingly, transmission loss of a high frequency signal can be reduced even in case of forming a conductor wiring layer capable of transmitting the high frequency signal to the surface by forming the insulating board of the porcelain. Voids formed between the glass matrix and the AlN particles in the porcelain can be reduced by reducing the content of metallic Al in the raw material and the porcelain. Thus it is made possible to maintain a high thermal conductivity of the porcelain, and to enhance the mechanical strength and to reduce the water absorption percentage.

When the content of metallic Al in the porcelain exceeds 800 ppm based on the total amount, voids are likely to be formed between the glass matrix and the AlN particles and the voids cause a decrease in the mechanical strength, lower insulation property due to water absorption by the porcelain, higher dielectric constant and an increase of dielectric loss.

It is important that the average particle diameter of the AlN particles is not less than 2 μm. When the average particle diameter of the AlN particles is smaller than 2 μm, degradation of densification of the porcelain occurs and causes a decrease in the mechanical strength, water absorption and an increase of dielectric loss. Taking an improvement in smoothness and strength of the surface of ceramics into consideration, the average particle diameter of the AlN particles is not more than 30 μm, preferably not more than 15 μm, and more preferably not more than 10 μm. The oxygen content of the AlN particles is preferably not more than 1.5% by weight in view of the decrease in dielectric loss and the improvement in thermal conductivity.

To improve the compatibility between the glass matrix and the AlN particles and to reduce the dielectric constant and the dielectric loss of the porcelain, the total amount of Li, K, Na, Pb and Bi is not more than 15% by weight, preferably not more than 5% by weight, more preferably not more than 1% by weight, and further preferably not more than 0.5% by weight, in terms of oxides ($Li_2O$, $K_2O$, $Na_2O$, PbO and $Bi_2O_3$). When the amount of metallic Al is lowered, the reactivity between the AlN particles and glass is decreased. Therefore, the total amount of Li, K, Na, Pb and Bi is allowed until 15% by weight. For the same reason, the content of B (boron) in the porcelain is not more than 10% by weight, preferably not more than 5% by weight, and more preferably not more than 3% by weight, in terms of oxides $B_2O_3$.

In view of the mechanical strength, the water absorption percentage, the thermal conductivity, the dielectric constant, and the dielectric loss, the content of the AlN particles in the porcelain is within a range from 35 to 80% by weight, and preferably from 40 to 60% by weight. The content of the AlN particles refers to a value determined from the X-ray diffraction pattern of the porcelain by the Rietveld method.

Furthermore, the porcelain may contain 0.1 to 30% by weight other filler components such as $Al_2O_3$, $SiO_2$ (quartz, cristobalite, tridymite), $3Al_2O_3 \cdot 2SiO_2$, $MgSiO_3$, $Mg_2SiO_4$, $CaMgSi_2O_6$, $Mg_2Al_4Si_5O_{18}$, $ZnAl_2O_4$, $MgAl_2O_4$, $CaAl_2Si_2O_8$, $SrAl_2Si_2O_8$, $BaAl_2Si_2O_8$, $Ca_2MgSiO_7$, $Sr_2MgSiO_7$, $Ba_2MgSiO_7$, ZnO, $CaSiO_3$, $SrSiO_3$, $BaSiO_3$, $Si_3N_4$, and SiC, in addition to the AlN particles, and the total amount of the other filler components and the AlN particles being not more than 80% by weight.

As the glass phase, for example, silica glass, borosilicate glass, aluminosilicate glass, Pb glass, Bi glass, alkali glass, alkali earth glass and aluminoborosilicate glass can be used. In view of the property capable of firing together with a low-resistance metal such as Cu or Ag, glasses such as aluminosilicate glass, aluminoborosilicate glass, alkali glass and alkali earth glass are preferably used.

As the crystal glass capable of precipitating from the above glass, for example, there can be preferably used $SiO_2$, $MgAl_2O_4$ (spinel), $ZnAl_2O_4$ (gahnite), Ca(Mg, Al), (Si, Al)$_2O_6$ (diopside), $CaMgSi_2O_7$ (akermanite), $Sr_2MgSiO_7$ (Sr-akermanite), $CaMgSiO_4$ (monticellite), $Ca_3MgSi_2O_8$ (merrillite), $Mg_2SiO_4$ (enstatite), $MgSiO_3$ (enstatite), $3Al_2O_3 \cdot 2SiO_2$ (mullite), $Mg_2Al_4Si_5O_{18}$ (cordierite), (Sr, Ca)$Al_2Si_2O_8$ (slawsonite), $CaAl_2Si_2O_8$ (anorthite), $BaAl_2Si_2O_8$ (celsian), (Ca, Sr)$SiO_3$, and $SrSiO_3$.

The porcelain of this embodiment has excellent characteristics such as high mechanical strength of not less than 200 MPa, particularly not less than 220 MPa, high thermal conductivity of not less than 4 W/m·K, particularly not less than 6 W/m·K, water absorption percentage of 0%, low dielectric constant, and low dielectric loss.

The method of producing the above porcelain will now be described below. First, 20 to 65% by weight of the above-described glass powder and 35 to 80% by weight of the AlN powder having an average particle diameter of not less than 2 $\mu$m are respectively weighed. The glass powder preferably has an average particle diameter of less than 2 $\mu$m, and particularly preferably not more than 1.8 $\mu$m, in view of densification of the porcelain at low temperature.

It is important that the AlN powder has an average particle diameter of not less than 2 $\mu$m. That is, when the average particle diameter of less than 2 $\mu$m, it becomes impossible to enhance an open porosity of the porcelain to 2% or less, particularly 1% or less, by firing at 1050° C. or lower.

To inhibit agglomeration of the AlN powder, thereby to enhance the dispersibility of the AlN powder in the slurry described below and to enhance the formability, the average particle diameter of the AlN powder is within a range from 2 to 30 $\mu$m, preferably from 3 to 15 $\mu$m, and more preferably from 4 to 10 $\mu$m. The average particle diameter of the AlN powder means a $d_{50}$ value determined by the microtrack method.

As described above, the direct nitriding method is preferably used to uniformly make the AlN powder having a large average particle diameter at a low cost. The acid content as impurity of the AlN powder is preferably not more than 2% by weight. The total amount of other impurities such as Fe, Si, C, Cu, Mn, Mg, Zn, Ni, Cr and Ti other than metallic Al in the AlN powder is preferably not more than 0.1% by weight.

According to the present invention, an AlN powder having a metallic Al content of not more than 1000 ppm, preferably not more than 800 ppm, and more preferably not more than 500 ppm, is used as the AlN powder. That is, when the content of metallic Al in the AlN powder exceeds 1000 ppm, metallic Al having a reactive activity and the glass powder in the AlN powder causes the reaction accompanied with gas evolution, thus forming voids between the glass and the AlN particles after firing and the voids cause a decrease in the mechanical strength, lower insulation property due to water absorption, higher dielectric constant and an increase of dielectric loss.

The method of reducing the amount of metallic Al in the AlN powder can be conducted by treating with a chemical. It is possible to apply the method of suspending the AlN powder in an alkali solution such as aqueous sodium hydroxide solution, heating the suspension thereby to promote the following reaction and to dissolve metallic Al in the AlN powder, and filtering and washing the suspension thereby to remove metallic Al in the AlN powder.

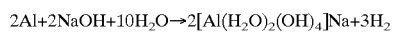

$$2Al + 2NaOH + 10H_2O \rightarrow 2[Al(H_2O)_2(OH)_4]Na + 3H_2$$

Then, a solvent is added to the above mixed powders, followed by mixing to prepare a slurry. As the solvent, water, alcohols such as isopropyl alcohol (IPA), and acetone can be used. In view of the safety and environmental protection, water is preferred. Organic binders such as polyvinyl alcohol (PVA), plasticizers, and dispersants may be added, together with the solvent. PVA also functions as a dispersant.

The slurry or granule is formed into a predetermined shape by the metallic mold pressing method, casting method, injection molding method, extrusion molding method, doctor blade method, or tape molding method such as calender roll method. Then, the resulting green body is firing in an oxidizing or non-oxidizing atmosphere at a temperature within a range from 800 to 1050° C., preferably from 800 to 970° C., for 30 minutes or more, thus obtaining a porcelain of this embodiment.

Figure 5:
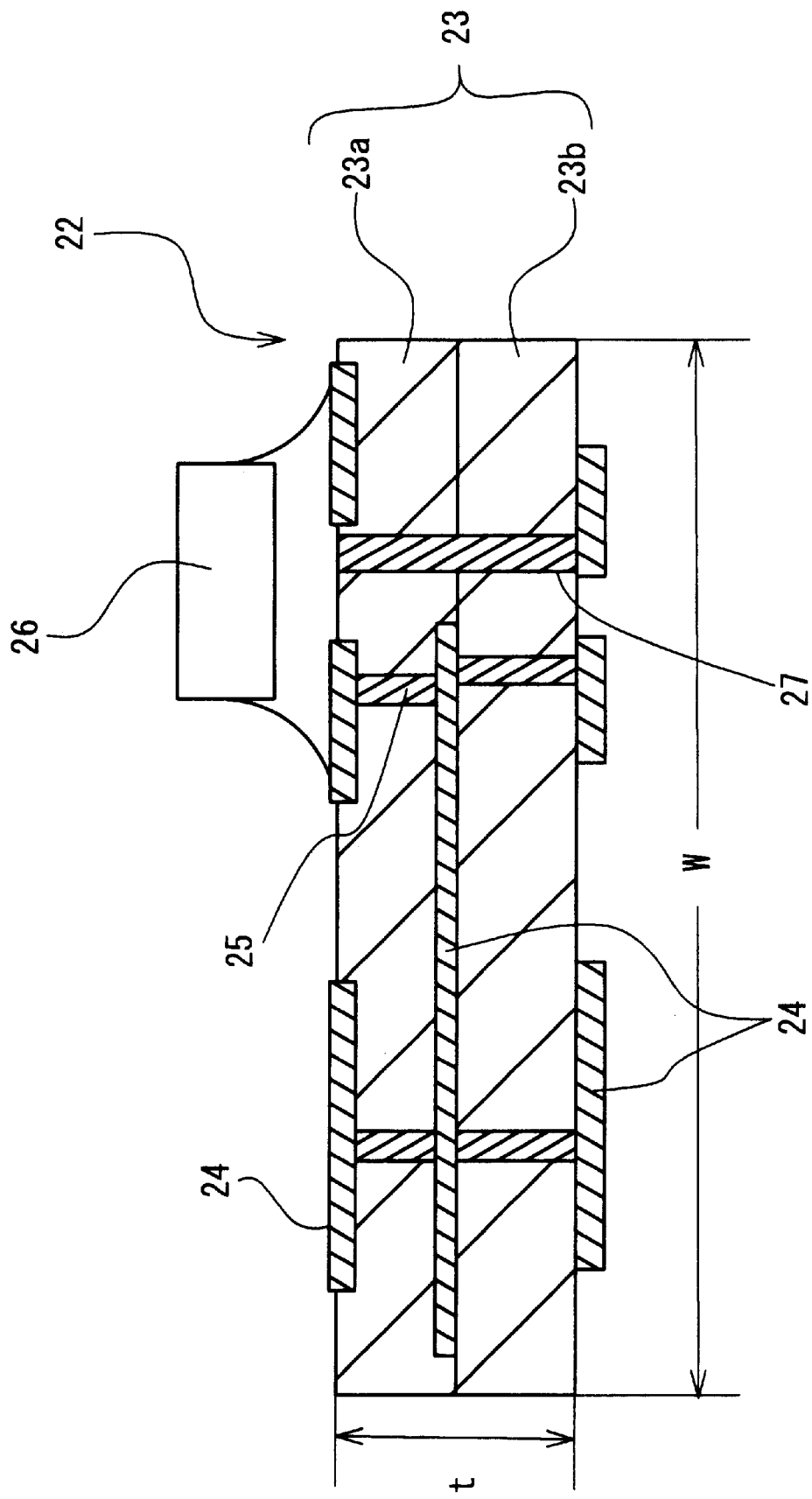
FIG. 5 is a schematic cross-sectional view showing another example of another semiconductor element housing package using the wiring board according to the present invention.

One example of the wiring board using this porcelain as the insulating board is shown in FIG. 5. As shown in FIG. 5, with respect to a wiring board 22, a conductor wiring layer 24 is formed on the surface of an insulating board 23, composed of a plurality of insulating layers 23a, 23b, and inside thereof. The insulating board 23, i.e. insulating layers 23a, 23b are made of the above-described porcelain. Therefore, since the insulating board 23 has a high mechanical strength of not less than 200 MPa, particularly not less than 220 MPa, it is made possible to prevent failure and peeling caused by stress applied on the porcelain during mounting of electronic parts such as semiconductor element and connection of leads to input/output terminal portions, and to improve the mechanical reliability. Furthermore, since the porcelain has a high thermal conductivity of not less than 4 W/m·K, particularly not less than 6 W/m·K, heat generated from the wiring board or electronic parts such as semiconductor element to be mounted into the wiring board is efficiently dissipated, thus making it possible to prevent error operation due to an increase in temperature of the electronic parts as compared with a conventional glass ceramic.

Since the insulating layer has a low dielectric constant and a low dielectric loss, it is made possible to satisfactorily transmit a high frequency signal while maintaining a small transmission loss of the signal even when transmitted the signal to the conductor wiring layer formed on the surface of the insulating layer.

To enhance the heat dissipation property while maintaining the strength of the insulating board 23, the total thickness of the insulating board 23 is not more than 2 mm, preferably from 0.2 to 1 mm, and more preferably from 0.3 to 0.8 mm. The thickness of the respective insulating layers 23a, 23b is not more than 250 μm, preferably not more than 200 μm, and more preferably not more than 150 μm.

The thickness of the insulating board 23 substantially refers to a thickness of only the insulating board 23, including no other members such as conductor wiring layer 24. Specifically, the thickness is calculated by the equation:

$$t=(S_1-S_2)/w$$

where w denotes a width, t denotes a thickness, $S_1$ (w×t) denotes a cross-sectional area of a wiring board 22 measured by a cross-sectional photograph of the wiring board 22, and $S_2$ denotes a total area of other members such as conductor wiring layer 24. In case the concave portion is formed in the wiring board 22, the thickness refers to a thickness from the bottom surface of the concave portion to that of the insulating board 23.

The conductor wiring layer 24 may be formed by coating with a conductor paste which contains Cu or Ag as a principal component and optionally contains metallic powders of Au, Al and Pd, or may be made of a high-purity metal having purity of not less than 99% or a metallic foil. Referring again to FIG. 5, spaces between conductor wiring layers 24, 24 formed on the upper and lower surfaces of the insulating layer 23a and the insulating layer 23b are electrically connected by a via hole conductor 25.

As shown in FIG. 5, an element 26 such as semiconductor element made of Si, Si—Ge, Ge—As or the like is mounted on the surface of the insulating board 23 and heat generated by the operation of the element 26 can be dissipated out of the insulating board 23 via the insulating board 23.

To enhance the heat dissipation property, a conductor layer for dissipation such as thermal via 27 is preferably formed on the surface of the insulating board 23 and/or inside thereof, in the wiring board 22. As shown in FIG. 5, the thermal via 27 is formed just under the element 26 in a thickness direction of the insulating board 23.

In case a high frequency signal of not less than 100 MHz, particularly not less than 1 GHz, more particularly not less than 20 GHz, is transmitted to the element 26 and the conductor wiring layer 24, the conductor wiring layer 24 is preferably composed of at least one of a strip line, microstrip line, a coplanar line and a dielectric waveguide to reduce transmission loss of a high frequency signal.

To make the above-described wiring board having the conductor wiring layer, a green sheet is made first by mixing the mixed powders with a proper organic binder and a proper solvent to prepare a slurry, and forming the slurry into a sheet by a tape molding method such as press molding method, extrusion molding method, doctor blade method or the like.

After through holes are optionally formed on the green sheet, the through holes are filled with a metallic paste containing a low-resistance metal such as Cu or Ag and a conductor wiring layer having a high frequency line pattern capable of transmitting a high frequency signal is print-coated on the surface of the green sheet in a thickness within a range from 5 to 30μ by the screen printing method, gravure printing method or the like using the metallic paste.

Plural green sheets with the conductor wiring layer formed thereon are optionally laminated and heat-boned at 40 to 120° C. under 5 to 40 MPa and then fired in an oxidizing or non-oxidizing atmosphere at 1050° C. or lower, preferably from 800 to 1000° C., more preferably from 800 to 970° C., for 0.2 to 10 hours, preferably 0.5 to 2 hours, thus obtaining a wiring board.

On the surface of the wiring board thus formed, an element such as semiconductor element is appropriately mounted and a wiring layer is connected thereto, thereby making it possible to transmit a signal. The semiconductor element is mounted directly on the conductor wiring layer, thereby connecting them, or the semiconductor element is fixed to the surface of the conductor wiring layer using an adhesive made of a resin or at least one of a resin, a metal and ceramic (e.g. Ag-epoxy, Ag-glass, Ag—Si, etc.) in a thickness of about 50 μm and the conductor wiring layer and the semiconductor element are connected with each other by wire bonding, TAB tape or the like.

Furthermore, the semiconductor element can be airtightly sealed by bonding the same insulating material as that of the insulating board, the other insulating material, or a cap having an electro-magnetic wave shielding property made of a metal having good heat dissipation property onto the surface of the wiring board with the semiconductor element mounted thereon, using glass, a resin, or an adhesive such as brazing material.

The method of forming the conductor wiring layer using a high-purity metal conductor capable of forming a fine conductor wiring layer with a high accuracy, particularly metallic foil, in place of the method of coating on the surface of the green sheet by the printing method using a metallic paste as described above.

To form the conductor wiring layer made of a metallic foil, for example, a conductor wiring layer with a predetermined pattern can be formed by the sputtering method, or thin-film forming method such as deposition method. However, the conductor wiring layer can also be formed easily by attaching a metallic foil onto a resin film, forming the metallic foil into a predetermined pattern by the plating method, and aligning and transferring the resin film with the metallic foil to the surface of the green sheet.

In case of laminating the green sheets described above, when a green sheet made of an inorganic composition, which can not be sintered at the firing temperature of the insulating board, is laminated on one surface, preferably both surfaces, of the green sheet with the conductor wiring board formed thereon and the laminate is then fired, it is made possible to inhibit shrinkage in both directions during firing of the insulating board and to enhance the shrinkage percentage, thereby to enhance the density of the porcelain and to further enhance contact between the glass matrix and the AlN particles. The inorganic composition can be easily removed by polishing or ultrasonic cleaning after the completion of firing.

As described above, by using the AlN powder having a reduced content of metallic Al of not more than 1000 ppm, which is obtained by treating the AlN powder having an average particle diameter of not less than 2 μm made by the direct nitriding method with a chemical, thereby to dissolve and remove metallic Al remained in the AlN powder, the reaction between the glass powder and the AlN powder accompanied with gas evolution is inhibited and the contact state between the glass matrix and the AlN particles is improved, thus making it possible to densify the porcelain. Therefore, a porcelain having a low dielectric constant and a low dielectric loss can be made while maintaining a high denseness, a high strength, a low water absorption percentage and a high thermal conductivity and can be used, particularly preferably, as an insulating board of a wiring board for high frequency, which has a conductor wiring layer containing Cu and Ag as a main component.

EXAMPLES

Example I

Five kinds of glasses with the compositions shown in Table 1 were prepared.

TABLE 1

| Kind of Glass | Composition (wt. %) | Glass Transition Temperature (° C.) |
|---|---|---|
| A | $SiO_2$ 26%-$Al_2O_3$ 10%-ZnO 15%-$B_2O_3$ 18%-BaO 26%-CaO 5% | 600 |
| B | $SiO_2$ 44%-$Al_2O_3$ 29%-MgO 11%-ZnO 7%-$B_2O_3$ 9% | 710 |
| C | $SiO_2$ 24%-$Al_2O_3$ 7%-MgO 8%-ZnO 16%-$B_2O_3$ 13%-SrO 32% | 570 |
| D | $SiO_2$ 43%-$Al_2O_3$ 7%-$B_2O_3$ 8%-BaO 37%-CaO 5% | 620 |
| E | $SiO_2$ 73%-$Al_2O_3$ 4%-CaO 13%-$Li_2O$ 8%-$K_2O$ 2% | 630 |

Each of these glasses was charged in a platinum crucible and then molten by heating in an air under the conditions of a temperature of 1200° C. for one hour. ALN ceramics, $Si_3N_4$ ceramics, SiC ceramics and BN ceramics, each having purity of 96%, a relative density of not less than 95% and a size of 10×10×0.5 mm, were respectively dipped in the molten glass for five minutes, and then taken up.

The glass adhered on the surface was removed from the taken-up ceramics by hydrogen fluoride and a weight loss per unit surface area was calculated. The results are shown in Table 2.

AlN, $Si_3N_4$, SiC and BN powders, as a non-oxide ceramic powder having an average particle diameter of not less than 0.5 μm, were mixed with each of the respective crystallized glass powders described above according to the formulations shown in Table 2.

An organic binder, a plasticizer and toluene were added to the mixture to prepare a slurry and, using the slurry, a green sheet having a thickness of 300 μm was made by the doctor blade method. Five green sheets were laminated and then heat-bonded at a temperature of 50° C. by applying a pressure of 100 kg/cm².

The resulting laminate was fired in an air under the conditions shown in Table 2 after removing the binder in an air at 500° C. to obtain a porcelain for insulating board. As a result of the analysis, the composition of the porcelain was the same as the starting composition.

The center portion of the resulting porcelain was mirror polished and micrographs (magnification: 200) of the structure at arbitrary ten positions were taken by a scanning electron microscope, and then a ratio of the number of circular voids to the total number of voids was calculated with respect to ten positions. Average values thereof are shown in Table 3.

The thermal conductivity of the resulting porcelain was measured by the laser flush method. The surface of the porcelain was coated with an In—Ga paste to form an electrode and the dielectric constant was measured at a measuring frequency of 1 MHz using a LCR meter. The measurement results are shown in Table 3. Crystal phases in the porcelain were identified by the measurement of X-ray diffraction and the crystal phases were shown in Table 3 in the order of decreasing the peak intensity.

Furthermore, 200 multi-layer wiring boards 35 mm square having a thickness of 1.2 mm were respectively made by forming via holes on the green sheet, filling via holes with a silver paste, print-coating a silver paste on the surface of the sheet to form a wiring pattern, forming an electrode layer connected conductively to an inner wiring layer on the bottom surface of the green sheet as a lowermost layer, laminating five green sheets, and firing the laminate under the same conditions as described above.

The dimensional dispersion was measured and the yield of non-defective units having a dimensional accuracy of ±350 μm was calculated. The results are shown in Table 3.

With respect to some samples, porcelains were made in the same manner as described above, except that cordierite and a $ZrO_2$ powders were used as the filler component in place of the non-oxide ceramic powder, and then the resulting porcelains were evaluated.

TABLE 2

| | Glass | | Filler | | Firing Condition | |
|---|---|---|---|---|---|---|
| No. | Kind | Amount (wt. %) | Weight Loss (g/cm²) | Kind | Amount (wt. %) | Temperature (° C.) | Time (hr) |
| *1 | A | 97 | 0.05 | AlN | 3 | 800 | 0.5 |
| 2 | A | 95 | 0.05 | AlN | 5 | 800 | 0.5 |
| 3 | A | 75 | 0.05 | AlN | 25 | 850 | 1 |
| 4 | A | 60 | 0.05 | AlN | 40 | 950 | 1 |
| 5 | A | 50 | 0.05 | AlN | 50 | 950 | 1 |
| 6 | A | 30 | 0.05 | AlN | 70 | 1000 | 1 |
| *7 | A | 25 | 0.05 | AlN | 75 | 1000 | 3 |
| *8 | B | 97 | 0.02 | AlN | 3 | 800 | 0.5 |
| 9 | B | 95 | 0.02 | AlN | 5 | 850 | 1 |
| 10 | B | 75 | 0.02 | AlN | 25 | 900 | 1 |
| 11 | B | 60 | 0.02 | AlN | 40 | 950 | 1 |
| 12 | B | 50 | 0.02 | AlN | 50 | 950 | 1 |
| *13 | B | 25 | 0.02 | AlN | 75 | 1000 | 3 |
| *14 | C | 97 | 0.03 | AlN | 3 | 800 | 0.5 |
| 15 | C | 95 | 0.03 | MN | 5 | 800 | 0.5 |
| 16 | C | 75 | 0.03 | AlN | 25 | 850 | 1 |
| 17 | C | 60 | 0.03 | AlN | 40 | 950 | 1 |
| 18 | C | 50 | 0.03 | AlN | 50 | 950 | 1 |
| 19 | C | 30 | 0.03 | AlN | 70 | 1000 | 1 |
| *20 | C | 25 | 0.03 | AlN | 75 | 1000 | 3 |
| 21 | B | 75 | 0.03 | $Si_3N_4$ | 25 | 900 | 1 |
| 22 | B | 60 | 0.03 | $Si_3N_4$ | 40 | 950 | 1 |
| 23 | B | 75 | 0.03 | SiC | 25 | 900 | 1 |
| 24 | B | 60 | 0.03 | SiC | 40 | 950 | 1 |

TABLE 2-continued

| | Glass | | Filler | | Firing Condition | |
|---|---|---|---|---|---|---|
| No. | Kind | Amount (wt. %) | Weight Loss (g/cm²) | Kind | Amount (wt. %) | Temperature (° C.) | Time (hr) |
| 25 | B | 75 | 0.03 | BN | 25 | 900 | 1 |
| 26 | B | 60 | 0.03 | BN | 40 | 950 | 1 |
| *27 | A | 60 | 0.05 | Cordierite | 40 | 950 | 1 |
| *28 | A | 60 | 0.05 | ZrO₂ | 40 | 950 | 1 |
| *29 | D | 75 | 0.16 | AlN | 25 | 900 | 1 |
| *30 | D | 60 | 0.16 | AlN | 40 | 950 | 1 |
| *31 | E | 75 | 0.22 | AlN | 25 | 900 | 1 |
| *32 | E | 60 | 0.22 | AlN | 40 | 950 | 1 |

Mark "*" indicates Sample not falling within the scope of the invention.

TABLE 3

| No. | Relative Density (%) | Circular Voids/ Total Voids (%) | Dielectric Constant | Thermal Conductivity (W/m · K) | Precipitated Crystal Phase[1] | Yield of Good Dimensional Accuracy Units (%) |
|---|---|---|---|---|---|---|
| *1 | 98.2 | 15 | 6.2 | 1.7 | Ce, ZA, AlN | 86 |
| 2 | 98.2 | 15 | 6.3 | 2 | Ce, ZA, AlN | 88.5 |
| 3 | 97.5 | 27 | 7.0 | 4.3 | Ce, AlN, ZA | 95 |
| 4 | 97.3 | 31 | 7.3 | 6.5 | AlN, Ce, ZA | 97 |
| 5 | 96.5 | 35 | 7.5 | 8.9 | AlN, Ce, ZA | 98 |
| 6 | 95.1 | 40 | 7.9 | 12.3 | AlN, Ce, ZA | 96.5 |
| *7 | 85.1 | 42 | 6.5 | 7.5 | AlN, Ce, ZA | 80 |
| *8 | 97.7 | 5 | 5.5 | 1.8 | Co, Mu, ZA, AlN | 88 |
| 9 | 97.5 | 5 | 5.5 | 2.2 | Co, Mu, ZA, AlN | 90.5 |
| 10 | 97.0 | 6 | 6.2 | 4.8 | AlN, Co, Mu, ZA | 97 |
| 11 | 96.8 | 6 | 6.6 | 7 | AlN, Co, Mu, ZA | 99.5 |
| 12 | 96.5 | 6 | 6.7 | 9.2 | AlN, Co, Mu, ZA | 99 |
| *13 | 80.2 | 10 | 5.2 | 7.1 | AlN, Co, Mu, ZA | 72.5 |
| *14 | 98.8 | 11 | 5.3 | 1.9 | ZA, SMA, Su, AlN | 88 |
| 15 | 98.8 | 11 | 5.4 | 2.3 | ZA, SMA, Su, AlN | 90 |
| 16 | 98.3 | 13 | 5.7 | 5.3 | ZA, SMA, AlN, Su | 97 |
| 17 | 97.8 | 13 | 6.3 | 7.5 | SMA, AlN, ZA, Su | 99 |
| 18 | 97.2 | 14 | 6.4 | 9.8 | SMA, AlN, ZA, Su | 98.5 |
| 19 | 95.7 | 15 | 6.6 | 13.5 | AlN, SMA, ZA, Su | 97 |
| *20 | 86.7 | 15 | 5.7 | 7.8 | AlN, SMA, ZA, Su | 81.5 |
| 21 | 96.5 | 9 | 5.6 | 5.1 | ZA, Si₃N₄, Su | 94.5 |
| 22 | 96.3 | 12 | 6.3 | 7.4 | AlN, Si₃N₄, SLi | 97 |
| 23 | 96.2 | 15 | 5.8 | 5.5 | ZA, SiC, Su | 92 |
| 24 | 95.9 | 17 | 6.4 | 7.7 | AlN, SiC, Su | 94.5 |
| 25 | 96.9 | 7 | 5 | 5.8 | ZA, BN, Su | 97 |
| 26 | 96.7 | 8 | 5 | 8 | BN, ZA, Su | 99 |
| *27 | 97.7 | 0 | 6.3 | 1.3 | Ce, ZA, Al₂O₃ | 98 |
| *28 | 97.1 | 0 | 7.2 | 0.8 | Ce, ZA, ZrO₂ | 96.5 |
| *29 | 72.1 | 85 | 4.5 | 1.9 | AlN, Ce | 45.5 |
| *30 | 82.1 | 82 | 4.8 | 2.5 | AlN, Ce | 80 |
| *31 | 66.5 | 98 | 3.8 | 1.5 | AlN, LA, CS | 2.5 |
| *32 | 78.9 | 96 | 4.0 | 2 | AlN, LA, CS | 6 |

Mark "*" indicates Sample not falling within the scope of the invention.
[1]Ce: CeAl₂Si₂O₈, ZA: ZnAl₂O₄, Mu: Mullite, Su: SrAl₂Si₂O₈, Co: Cordierite, LA: LiAlSi₂O₆, CS: CaSiO₃, LA: LiAlSi₂O₆, CS: CaSiO₃, SMA: Sr₂MgSi₂O₇

As is apparent from Table 1 to Table 3, in porcelains obtained by mixing a borosilicate glass having a glass transition temperature of 800° C. or lower, wherein a weight loss per unit surface area of the non-oxide ceramics is not more than 0.15 g/cm² after dipping the non-oxide ceramic having purity of not less than 96% by weight in a glass melt obtained by melting the borosilicate glass with heating at 1200° C. for five minutes, with the non-oxide ceramic filler as the glass in a predetermined ratio, and firing the mixture, the non-oxide ceramic phase exists in almost the same amount as that of the filler with the starting composition and the porcelains showed such good results that the thermal conductivity is not less than 2 W/m·K, the dielectric constant is not more than 8, and the yield of non-defective units having a good dimensional accuracy is not less than 85%.

In any of samples Nos. 1, 8 and 14 wherein the amount of the non-oxide ceramic filler is less than 5% by weight, the thermal conductivity was less than 2 W/m·K. On the other hand, in any of samples Nos. 7, 13 and 20 wherein the amount of the non-oxide ceramic filler is more than 70% by weight, dense porcelains could not be obtained.

In any of samples Nos. 27 and 28 wherein cordierite and ZrO₂ were used as the filler in place of the non-oxide ceramic filler, the thermal conductivity was less than 2 W/m·K. In any of samples Nos. 29, 30, 31 and 32 wherein a weight loss is more than 0.15 g/cm² after dipping non-oxide ceramics in a glass melt obtained by melting glass with heating at 1200° C. for five minutes, the glass and the filler react with each other to evolve a gas, thus drastically degrade the dimensional accuracy.

Example II

Seven kinds of glasses with the compositions shown in Table 4 were prepared.

TABLE 4

| Kind of Glass | Composition (wt. %) | Glass Transition Temperature (° C.) |
|---|---|---|
| F | $SiO_2$ 44%-$Al_2O_3$ 29%-MgO 11%-ZnO 7%-$B_2O_3$ 9% | 690 |
| G | $SiO_2$ 24%-$Al_2O_3$ 7%-MgO 8%-ZnO 16%-$B_2O_3$ 13%-CaO 32% | 575 |
| H | $SiO_2$ 24%-$Al_2O_3$ 7%-MgO 8%-ZnO 16%-$B_2O_3$ 13%-SrO 32% | 560 |
| I | $SiO_2$ 24%-$Al_2O_3$ 7%-MgO 8%-ZnO 16%-$B_2O_3$ 13%-BaO 32% | 570 |
| J | $SiO_2$ 43%-$Al_2O_3$ 7%-$B_2O_3$ 8%-BaO 37%-$Bi_2O_3$ 5% | 620 |
| K | $SiO_2$ 73%-$Al_2O_3$ 4%-CaO 13%-$Li_2O$ 8%-$K_2O$ 2% | 630 |
| L | $SiO_2$ 24%-$Al_2O_3$ 10%-ZnO 15%-$B_2O_3$ 18%-BaO 28%-CaO 5% | 600 |

AlN, $Si_3N_4$, SiC and BN powders, as a non-oxide ceramic powder (filler) having an average particle diameter of 2 μm, were mixed with each of these glass powders according to the formulations shown in Table 5.

An organic binder, a plasticizer and toluene were added to the mixture to prepare a slurry and, using the slurry, a green sheet having a thickness of 300 μm was made by the doctor blade method. Five green sheets were laminated and then heat-bonded at a temperature of 50° C. by applying a pressure of 100 kg/cm². The resulting laminate was fired in an air under the conditions shown in Table 5 after removing the binder in an air at 500° C. to obtain a porcelain for insulating board.

The thermal conductivity and the dielectric constant at a measuring frequency of 1 MHz of the resulting porcelain were measured in the same manner as in Example I. The measurement results are shown in Table 5.

In the resulting porcelain, various crystal phases were confirmed, in addition to glass phases containing constituent metal elements and oxygen in the glass used. The crystal phases were identified by the measurement of X-ray diffraction and the crystal phases were shown in Table 5 in the order of decreasing the peak intensity, together with the glass phases. A gahnite crystal phase and a spinel crystal phase were described as the gahnite crystal phase without distinguishing them in the table because peaks thereof overlap with each other.

Furthermore, 200 multi-layer wiring boards 35 mm square having a thickness of 1.2 mm were respectively made by forming via holes on the green sheet, filling via holes with a silver paste, printing and coating a silver paste on the surface of the sheet to form a wiring pattern, forming an electrode layer conducting to an inner wiring layer on the bottom surface of the green sheet as a lowermost layer, laminating five green sheets, and firing the laminate under the same conditions as described above.

The dimensional dispersion was measured and the yield of non-defective units was calculated with respect to a dimensional accuracy of ±350 μm as a standard value. The results are shown in Table 5.

With respect to some samples, porcelains were made in the same manner as described above, except that cordierite and a $ZrO_2$ powders were used as the filler component in place of the non-oxide ceramic powder, and then the resulting porcelains were evaluated.

The bending strength of the sintered body was measured by the three-point bending test in accordance with JIS R1601. After grinding the sintered body, the true specific gravity was determined in a gas phase and the bulk density was determined by the Archimedean method, and then the relative density was calculated. The results are shown in Table 5.

TABLE 5

| | Glass | | Filler | | Firing Condition | | Relative | | Thermal | | | Yield of Good Dimensional |
|---|---|---|---|---|---|---|---|---|---|---|---|---|
| No. | Kind | Amount (wt. %) | Kind | Amount (wt. %) | Temperature (° C.) | Time (hr) | Density (%) | Strength (MPa) | Conductivity (W/m · K) | Dielectric Constant | Crystal Phase[1] | Accuracy Units (%) |
| *33 | F | 97 | AlN | 3 | 800 | 0.5 | 97.7 | 170 | 1.8 | 5.5 | Co,AlN,G,Mu,Ga | 88 |
| 34 | F | 95 | AlN | 5 | 850 | 1 | 97.5 | 210 | 2.2 | 5.5 | Co,AlN,G,Mu,Ga | 90.5 |
| 35 | F | 90 | AlN | 10 | 900 | 1 | 97.3 | 230 | 3 | 5.8 | AlN,Co,G,Mu,Ga | 95 |
| 36 | F | 75 | AlN | 25 | 900 | 1 | 97 | 260 | 4.8 | 6.2 | AlN,Co,G,Mu,Ga | 97 |
| 37 | F | 60 | AlN | 40 | 950 | 1 | 96.8 | 250 | 7 | 6.6 | AlN,Co,Mu,G,Ga | 99.5 |
| 38 | G | 75 | AlN | 25 | 850 | 1 | 98 | 250 | 4 | 6.1 | Ga,AlN,Qu,G,An | 94.5 |
| 39 | G | 60 | AlN | 40 | 950 | 1 | 97.5 | 250 | 6.4 | 6.6 | Ga,AlN,An,Qu,G | 97 |
| *40 | H | 97 | AlN | 97 | 800 | 0.5 | 98.8 | 160 | 1.9 | 5.3 | Ga,Su,AlN,G,SP | 88 |
| 41 | H | 95 | AlN | 5 | 800 | 1 | 98.8 | 200 | 2.3 | 5.4 | Ga,Su,AlN,G,SP | 90 |
| 42 | H | 90 | AlN | 10 | 800 | 1 | 98.5 | 240 | 3.3 | 5.5 | Ga,Su,AlN,SP,G | 94.5 |
| 43 | H | 75 | AlN | 25 | 850 | 1 | 98.3 | 270 | 5.3 | 5.7 | Ga,Su,AlN | 97 |
| 44 | H | 60 | AlN | 40 | 900 | 1 | 97.8 | 270 | 7.5 | 6.3 | Ga,Su,AlN | 99 |
| 45 | H | 30 | AlN | 70 | 1000 | 3 | 95.7 | 200 | 9.8 | 6.6 | AlN,Ga,Su | 97 |
| *46 | H | 25 | AlN | 75 | 1000 | 5 | 86.7 | 130 | not sintered | | | 81.5 |
| 47 | I | 75 | AlN | 25 | 850 | 1 | 98.4 | 250 | 5.1 | 5.7 | Ga,G,Ce,AlN | 96 |
| 48 | I | 60 | AlN | 40 | 950 | 1 | 97.9 | 240 | 6 | 6.2 | Ga,Ce,AlN,G | 98.5 |
| 49 | F | 75 | $Si_3N_4$ | 25 | 900 | 1 | 96.5 | 260 | 4.5 | 6.2 | $Si_3N_4$,Co,Mu,G,Ga | 94.5 |
| 50 | F | 60 | $Si_3N_4$ | 40 | 950 | 1 | 96.3 | 270 | 6.6 | 6.6 | $Si_3N_4$,Co,Mu,Ga,G | 97 |
| 51 | F | 75 | SiC | 25 | 900 | 1 | 96.2 | 240 | 5 | 6.3 | SiC,Ga,Co,G,Mu | 92 |
| 52 | F | 60 | SiC | 40 | 950 | 1 | 95.9 | 240 | 7.3 | 6.8 | SiC,Ga,Co,Mu,G | 94.5 |
| 53 | F | 75 | BN | 25 | 900 | 1 | 96.9 | 270 | 5.2 | 5.1 | BN,Ga,Co,Mu | 97 |
| 54 | F | 60 | BN | 40 | 950 | 1 | 96.7 | 270 | 7.5 | 5 | BN,Ga,Co,G,Mu | 99 |
| *55 | F | 60 | Cordierite | 40 | 950 | 1 | 97.7 | 200 | 1.2 | 5.5 | Co,Mu,G,Ga | 98 |

TABLE 5-continued

| | Glass | | Filler | | Firing Condition | | Relative | | Thermal | | | | Yield of Good Dimensional |
|---|---|---|---|---|---|---|---|---|---|---|---|---|---|
| No. | Kind | Amount (wt. %) | Kind | Amount (wt. %) | Temperature (° C.) | Time (hr) | Density (%) | Strength (MPa) | Conductivity (W/m · K) | Dielectric Constant | Crystal Phase[1] | | Accuracy Units (%) |
| *56 | F | 60 | $ZrO_2$ | 40 | 950 | 1 | 97.1 | 240 | 0.9 | 5.9 | $ZrO_2$,Co,Mu,G,Ga | | 98.5 |
| *57 | J | 75 | AlN | 25 | 900 | 1 | 72.1 | <100 | 4.2 | 1.9 | G,Ce,AlN | | 45.5 |
| *58 | J | 60 | AlN | 40 | 950 | 1 | 82.1 | <100 | 4.5 | 2.5 | AlN,G,Ce | | 80 |
| *59 | K | 75 | AlN | 25 | 900 | 1 | 66.5 | <100 | 3.5 | 1.5 | G,LA,AlN,CS | | 2.5 |
| *60 | K | 60 | AlN | 40 | 950 | 1 | 78.9 | <100 | 3.8 | 2 | AlN,G,LA,CS | | 6 |
| 61 | L | 95 | AlN | 5 | 800 | 1 | 97.7 | 200 | 2.2 | 6 | Ce,G,Ga,AlN | | 91 |
| 62 | L | 90 | AlN | 10 | 800 | 1 | 98.6 | 240 | 3.1 | 6.1 | Ce,Ga,G,AlN | | 92.5 |
| 63 | L | 75 | AlN | 25 | 800 | 1 | 99 | 270 | 4.8 | 6.5 | Ce,AlN,G,Ga | | 96.5 |
| 64 | L | 60 | AlN | 40 | 800 | 1 | 99.2 | 320 | 6.9 | 7.2 | Ce,AlN,Ga,G | | 98 |
| 65 | L | 40 | AlN | 60 | 950 | 1 | 95.4 | 230 | 9.5 | 7.5 | AlN,Ce,Ga,G | | 94 |

Mark"*"indicates Sample not falling within the scope of the invention.
[1]Ga: $ZnAl_2O_4$, Mu: Mullite, Co: Cordierite, An: $CaAl_2Si_2O_8$, G: Glass
Su: $SrAl_2Si_2O_8$, Ce: $BaAl_2Si_2O_8$, Qu: $SiO_2$, LA: $LiAlSi_2O_6$, CS: $CaSiO_3$ As is apparent from Table 4 and Table 5, in case porcelains, which are obtained by mixing a glass powder containing at least $SiO_2$, $Al_2O_3$, ZnO and $B_2O_3$ with a non-oxide ceramic powder in each predetermined amount, and firing the mixture, contain a spinel compound crystal phase and a non-oxide ceramic phase made of at least one selected from AlN, $Si_3N_4$, SiC and BN, the porcelains exhibit a high thermal conductivity such as 2 W/m·K or more and also have a low dielectric constant of not more than 8, a high strength and a high dimensional accuracy.

In samples Nos. 33 and 40 wherein the amount of the borosilicate glass is more than 95% by weight, that is, the amount of the non-oxide ceramic filler is less than 5% by weight, the effect of improving the thermal conductivity due to the non-oxide ceramic filler becomes insufficient and the thermal conductivity is less than 2 W/m·K.

In the sample No. 46 wherein the amount of the glass is less than 30% by weight, that is, the amount of the non-oxide compound is more than 70% by weight, dense porcelains could not be obtained. In samples Nos. 55 and 56 wherein cordierite and $ZrO_2$ were used in place of the non-oxide compound, the thermal conductivity was less than 2 W/m·K.

In samples 57 to 60 using glasses E and F containing a large amount of $Bi_2O_3$ and an alkali metal oxide, the glass and the non-oxide compound react with each other and satisfactory dimensional accuracy can not obtained.

Example III

Three kinds of glass powders (glasses A to C, having an average particle diameter of 1.8 μm) with the following compositions were prepared.
(Glass P)
20.2% $SiO_2$-6.9% $Al_2O_3$-33.9% SrO-8.2% Mg-0.06% CaO-0.46% BaO-16.5% ZnO-13.7% $B_2O_3$-0.03% $Li_2O$-0.02% $Na_2O$-0.03% $Fe_2O_3$
(Glass Q)
10.4% $SiO_2$-2.5% $Al_2O_3$-35.2% ZnO-45.3% $B_2O_3$-6.6% $Na_2O$
(Glass R)
50% $SiO_2$-5.5% $Al_2O_3$-18.5% MgO-26% CO On the other hand, a powder obtained by grinding an AlN powder having an oxygen content of 0.9% by weight and an average-particle diameter of 20 μm made by the direct nitriding method was suspended in an aqueous 20 wt % sodium hydroxide solution and the suspension was heated to cause the following reaction, thus removing a metallic Al in the AlN powder.

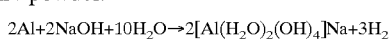

$$2Al+2NaOH+10H_2O \rightarrow 2[Al(H_2O)_2(OH)_4]Na+3H_2$$

In that case, by changing the heat treatment time of the suspension, plural kinds of AlN powders having different metallic Al contents shown in Table 6 were made.

With respect to the resulting AlN powder, a $d_{50}$ value was determined by the microtrack method and the $d_{50}$ value was taken as the average particle diameter of the AlN powder. The AlN powder was suspended in an aqueous 20 wt % sodium hydroxide solution and, after heating at 80° C. for one hour, the amount of a hydrogen gas evolved from the suspension was measured by gas chromatography and the residual amount of metallic Al (described as the amount of metallic Al of the AlN powder in the table). The results are shown in Table 6.

The glass powder was mixed with the AlN powder in the ratio shown in Table 6 and an organic binder, a plasticizer and toluene were added to the mixture to prepare a slurry. Using the slurry, a green sheet having a thickness of 300 μm was made by the doctor blade method. Ten to fifteen green sheets were laminated and then heat-bonded at a temperature of 50° C. by applying a pressure of 10 MPa. The resulting laminate was fired in dry nitrogen 950° C. for one hour after removing the binder in a water vapor-containing nitrogen atmosphere at 700° C. Upon firing, the heating rate and cooling rate were respectively adjusted to 300° C./hour.

With respect to the resulting porcelain, the open porosity was measured by the Archimedean method. The dry weight ($w_1$) and the wet weight ($w_2$) of the porcelain were measured and the water absorption percentage was calculated by $[(w_2-w_1)/w_1] \times 100$ (%).

The average particle diameter of the AlN particles was determined from cross-sectional micrographs of the resulting porcelain at arbitrary five positions by the Ruzex analysis. Furthermore, the amount of metallic Al in the porcelain was calculated by the same method as that of measuring the amount of metallic Al of the above-described AlN powder (raw material) with respect to the powder obtained by grinding the porcelain. The crystal phases were identified by the measurement of X-ray diffraction and the content of the AlN particles in the porcelain was calculated from the pattern by the Rietveld method.

After cutting the porcelain into a shape having a diameter of 50 mm and a thickness of 1 mm, resonance characteristics of a $TE_{011}$ mode were measured at 2 GHz by the cavity resonance method using a network analyzer and a synthesized sweeper and the dielectric constant and dielectric loss were calculated. A thermal expansion curve at a temperature ranging from room temperature to 400° C. was made and the thermal expansion coefficient was calculated. The three-point bending strength was measured in accordance with JIS R1601. Sample having a diameter of 10 mm and a thickness of 1 mm were made from the porcelain and the thermal conductivity of the resulting porcelain was measured by the laser flush method. The results are shown in Table 6.

could not adjusted to 1% or less and the strength was low. Also the insulating property was degraded by water absorption and the dielectric loss was enhanced. In the sample No. 80 wherein the average particle diameter of the AlN particles is less than 2 μm the average particle diameter of the AlN particles in the porcelain is less than 2 μm, the open porosity of the porcelain could not adjusted to 1% or less and the strength was low. Also the insulating property was degraded by water absorption and the dielectric loss was enhanced.

TABLE 6

| | Starting Materials | | | | | | | | | | | | | |
|---|---|---|---|---|---|---|---|---|---|---|---|---|---|---|
| | | AlN Powders | | | | AlN Particles | | | | | Thermal Expansion Coefficient $\times 10^{-6}/$ °C. | Thermal Conductivity (W/m · K) | | |
| | Glass | | Average Particle Diameter (μm) | Metallic Al (ppm) | Porosity (%) | Water Absorption (%) | Average Particle Diameter (μm) | Metallic Al (ppm) | wt. % | Dielectric Constant | Dielectric Loss $\times 10^{-4}$ | | | Strength (MPa) | Crystal Phase[1] |
| No. | Kind | wt. % | | | | | | | | | | | | |
| *66 | P | 60 | 5 | 6000 | 40 | foam | — | — | — | — | — | — | — | — | SAON, AN,A |
| *67 | P | 60 | 5 | 3000 | 40 | 1.5 | 1.5 | 4.9 | 1180 | 39 | 11 | 700 | 7 | 2.5 | 180 | SA,SR,Z, SAON, AN,A |
| *68 | Q | 50 | 5 | 3000 | 50 | 2.0 | 2.0 | 4.5 | 1480 | 48 | 12 | 1000 | 8 | 2.0 | 170 | G,SAON, AN |
| *69 | R | 60 | 5 | 3000 | 40 | 1.5 | 1.0 | 4.9 | 1190 | 40 | 12 | 1000 | 8 | 2.5 | 190 | DI,SA, N,A |
| 70 | P | 60 | 5 | 1000 | 40 | 0.5 | 0 | 4.7 | 395 | 37 | 11 | 60 | 7 | 9 | 200 | SA,SR,Z, SAON, AN |
| 71 | P | 50 | 5 | 1000 | 50 | 0.2 | 0 | 4.7 | 490 | 46 | 10 | 50 | 7 | 10 | 200 | SA,SR,Z, SAON, AN |
| 72 | P | 40 | 5 | 1000 | 60 | 2 | 0 | 4.9 | 550 | 58 | 9 | 50 | 6 | 12 | 255 | SA,SRZ, SAON, AN |
| 73 | Q | 60 | 5 | 1000 | 40 | 0.2 | 0 | 4.9 | 390 | 39 | 9 | 60 | 6 | 6.5 | 250 | DI,AN |
| 74 | R | 60 | 5 | 1000 | 40 | 0.2 | 0 | 4.8 | 480 | 50 | 9 | 65 | 6 | 8 | 200 | SA,SR,Z, SAON, AN |
| 75 | P | 25 | 5 | 1000 | 40 | 0.2 | 0 | 4.9 | 395 | 39 | 10 | 60 | 6 | 8 | 250 | G,SA,SR, Z,SAON, AN |
| | R | 35 | | | | | | | | | | | | | | |
| 76 | P | 40 | 5 | 1000 | 50 | 0.2 | 0 | 4.9 | 480 | 50 | 10 | 60 | 7 | 11 | 250 | G,SA,SR, SAON, AN |
| | Q | 10 | | | | | | | | | | | | | | |
| 77 | P | 20 | 5 | 1000 | 80 | 0.2 | 0 | 4.9 | 780 | 75 | 10 | 30 | 7.4 | 12.5 | 230 | SA,SR,Z, SAON, AN |
| 78 | P | 50 | 5 | 300 | 50 | 0.2 | 0 | 4.9 | 145 | 48 | 8 | 40 | 7 | 10 | 230 | SA,SR,Z, SAON, AN |
| 79 | P | 50 | 5 | 100 | 50 | 0.1 | 0 | 4.8 | <100 | 48 | 8 | 10 | 7 | 12 | 200 | SA,SR,Z, SAON, AN |
| *80 | P | 50 | 0.9 | 300 | 50 | 2 | 2 | 0.9 | 145 | 49 | 6.5 | 300 | 7 | 3.5 | 130 | SA,SR,Z, SAON, AN |
| 81 | P | 50 | 3 | 300 | 50 | 0.5 | 0.2 | 3.0 | 140 | 49 | 8 | 30 | 7 | 8 | 200 | SA,SR,Z, SAON, AN |
| 82 | P | 50 | 10 | 300 | 50 | 0.3 | 0.1 | 9.0 | 145 | 50 | 8 | 35 | 6 | 15 | 200 | SA,SR,Z, SAON, AN |

Mark "*" indicates Sample not falling within the scope of the invention.
[1]AN: AlN, SAON: $Si_{1.8}Al_{0.2}O_{1.2}N_{1.8}$, SA: Sr-Akermanite, SR: Slawsonite, Z: Gahnite, Al: Metallic Al, DI: Diopside, G: Glass Phase As is apparent from Table 6, in samples Nos. 60 to 69 wherein the amount of metallic Al in the AlN powder is more than 1000 ppm, the open porosity of the porcelain In any of porcelains of samples Nos. 70 to 79, 81 and 82, which contains an AlN powder having the average particle diameter of not less than 2 μm and the metallic Al content of not more than 1000 ppm, they had excellent characteristics such as thermal conductivity of not less than 4 W/m·K, strength of not less than 200 MPa, water absorption percentage of not more than 0.2%, dielectric constant at a measuring frequency of 2 GHz of not more than 10, and dielectric loss of not more than $70 \times 10^{-4}$.

(Production of Wiring Board)

A wiring board having conductor wiring layers made of Cu as the principal component formed on the surface and inside thereof was made by forming via holes on a green sheet, as a sample No. 79 of Example III, at predetermined positions thereof, filling the via holes with an electrically conductive paste containing a Cu powder as a principal component by the screen printing process, forming an electrically conductive wiring layer of a predetermined pattern made of the electrically conductive paste on the surface of the green sheet, laminating a plurality of green sheets under pressure while aligning the wiring layer and the via hole conductors, and firing the resulting laminate in the same manner as described above. The wiring board thus obtained showed satisfactory electrical conductivity upon testing the connection between the conductors via the via hole conductor.

What is claimed is:

1. A porcelain comprising;
    a glass phase;
    a spinel compound crystal phase; and
    a non-oxide ceramic phase made of at least one selected from the group consisting of AlN, $Si_3N_4$, SiC and BN,
    wherein the porcelain has a relative density that is not less than 95% and a dielectric constant that is not more than 8, and a thermal conductivity that is not less than 2 W/m·K, and
    wherein the porcelain is formed by mixing powders of 30 to 95% by weight of a borosilicate glass powder containing at least $SiO_2$, $Al_2O_3$, ZnO and $B_2O_3$ and 5 to 70% by weight of at least one of a non-oxide ceramic finer selected from the group consisting of AlN, $Si_3N_4$, SiC and BN, forming said powders into a predetermined shape and firing, and
    wherein said borosilicate glass powder contains 10 to 55% by weight of $SiO_2$, 3 to 35% by weight of $Al_2O_3$, 2 to 25% by weight of ZnO, 3 to 25% by weight of $B_2O_3$, 0 to 30% by weight of MgO, and 0 to 50% by weight of at least one selected from CaO, SrO and BaO.

2. A porcelain comprising;
    a glass phase;
    a spinel compound crystal phase; and
    a non-oxide ceramic phase made of at least one selected from the group consisting of AlN, $Si_3N_4$, SiC and BN,
    wherein the porcelain has a relative density that is not less than 95% and a dielectric constant that is not more than 8, and a thermal conductivity that is not less than 2 W/m·K and
    wherein the porcelain is formed by mixing powders of 30 to 95% by weight of a borosilicate glass powder containing at least $SiO_2$, $Al_2O_3$, ZnO and $B_2O_3$ and 5 to 70% by weight of at least one of a non-oxide ceramic filler selected from the group consisting of AlN, $Si_3N_4$, SiC and BN, forming said powders into a predetermined shape and firing, and
    said porcelain further comprising at least one of a (M1) $Al_2Si_2O_7$ (M1 is at least one of Ca, Sr and Ba) crystal phase and a $(M2)_2MgSi_2O_7$ (M2 is at least one of Ca, Sr and Ba) crystal phase as a second most prevalent crystal phase as measured by peak intensity using x-ray diffraction.

3. A porcelain comprising:
    a glass phase;
    a spinel compound crystal phase; and
    a non-oxide ceramic phase made of at least one selected from the group consisting of AlN, $Si_3N_4$, SiC and BN,
    wherein the porcelain has a relative density that is not less than 95% and a dielectric constant that is not more than 8, and a thermal conductivity that is not less than 2 W/m·K, and
    wherein the porcelain is formed by mixing powders of 30 to 95% by weight of a borosilicate glass including $SiO_2$, $Al_2O_3$, ZnO and $B_2O_3$ and 5 to 70% by weight of at least one of a non-oxide ceramic filler selected from the group consisting of AlN, $Si_3N_4$, SiC and BN, forming said powders into a predetermined shape and firing.

4. A porcelain according to claim 3, wherein said spinel compound comprises gahnite ($ZnAl_2O_4$) anchor spinel ($MgAl_2O_4$).

5. A porcelain according to claim 3, further comprising at least one of a mullite crystal phase and a cordierite crystal phase as a second most prevalent crystal phase as measured by peak intensity using x-ray diffraction.

6. A porcelain comprising;
    a spinel compound crystal phase,
    a non-oxide ceramic phase made of at least one selected the group consisting of AlN, $Si_3N_4$, SiC and BN, and
    at least one crystal phase selected from the group consisting of a (M1) $Al_2Si_2O_8$ (M1 is at least one of Ca, Sr and Ba) crystal phase and a $(M2)_2MgSi_2O_7$ (M2 is at least one of Ca, Sr and Ba) crystal phase; and the at least one crystal phase is a most prevalent crystal phase as measured by peak intensity using x-ray diffraction;
    wherein the porcelain has a relative density that is not less than 95% and a dielectric constant that is not more than 8, and a thermal conductivity that is not less than 2 W/m·K.

7. A porcelain according to claim 6, wherein said spinel compound comprises gahnite ($ZnAl_2O_4$) and/or spinel ($MgAl_2O_4$).

8. A porcelain according to claim 6, further comprising at least one of a mullite crystal phase and a cordierite crystal phase as a second most prevalent crystal phase as measured by peak intensity using x-ray diffraction.

9. A porcelain according to claim 6, wherein the porcelain is formed by mixing powders of 30 to 95% by weight of a borosilicate glass powder containing at least $SiO_2$, $Al_2O_3$, ZnO and $B_2O_3$, and at least one oxide selected from the group consisting of MgO, CaO, SrO and BaO, and 5 to 70% by weight of at least one of a non-oxide ceramic filler selected from the group consisting of AlN, $Si_3N_4$, SiC and BN, forming said powders into a predetermined shape and firing.

10. A porcelain according to claim 9, wherein said borosilicate glass powder contains 10 to 55% by weight of $SiO_2$, 3 to 35% by weight of $Al_2O_3$, 2 to 25% by weight of ZnO, 3 to 25% by weight of $B_2O_3$, and further contains either 30% by weight or less of MgO or 50% by weight or less of at least one selected from CaO, SrO and BaO.

* * * * *